United States Patent [19]
Heffernan et al.

[11] Patent Number: 6,084,898
[45] Date of Patent: Jul. 4, 2000

[54] LASER DEVICES INCLUDING SEPARATE CONFINEMENT HETEROSTRUCTURE

[75] Inventors: Jonathan Heffernan, Oxford; Geoffrey Duggan, Deddington, both of United Kingdom

[73] Assignee: Sharp Kabushiki Kaisha, Osaka, Japan

[21] Appl. No.: 08/991,237

[22] Filed: Dec. 16, 1997

[30] Foreign Application Priority Data

Dec. 21, 1996 [GB] United Kingdom .................. 9626657

[51] Int. Cl.[7] ...................................... H01S 3/19
[52] U.S. Cl. .......................... 372/45; 372/43; 372/46; 372/50
[58] Field of Search .................. 372/43, 44, 45, 372/46, 47, 48, 50

[56] References Cited

U.S. PATENT DOCUMENTS

| | | | |
|---|---|---|---|
| 5,400,355 | 3/1995 | Ishida | 372/46 |
| 5,448,585 | 9/1995 | Belenky et al. | 372/45 |
| 5,483,547 | 1/1996 | Adams et al. | 372/45 |
| 5,509,024 | 4/1996 | Bour et al. | 372/45 |
| 5,588,015 | 12/1996 | Yang | 372/45 |
| 5,604,762 | 2/1997 | Morinaga et al. | 372/43 |
| 5,692,002 | 11/1997 | Mizutani | 372/46 |
| 5,751,754 | 5/1998 | Takagi | 372/46 |
| 5,812,575 | 9/1998 | Choi | 372/45 |
| 5,848,085 | 12/1998 | Nitta | 372/45 |

FOREIGN PATENT DOCUMENTS

| | | | |
|---|---|---|---|
| 0345971 | 12/1989 | European Pat. Off. | 372/45 X |
| 0506049 | 9/1992 | European Pat. Off. | 372/45 X |
| 08 181378 | 7/1996 | Japan | 372/45 X |

OTHER PUBLICATIONS

Search Report for Application No. 97310362.5–2214–; Dated Apr. 20, 1998, (EPO).

Search Report for Application No. GB 9626657.2; Dated Mar. 12, 1997.

D.P. Bour et al.; IEEE Journal of Quantum Electronics, vol. 30, No. 2, pp. 593–606, 1994, "Strained $Ga_xIn_{1-x}P/(AlG_a)_{0.5}In_{0.5}P$ Heterostructures and Quantum–Well Laser Diodes".

P. Bhattacharya et al., IEEE Journal of Quantum Electronics, vol., 32, No. 9, pp. 1620–1629, "Tunneling Injection Lasers: A New Class of Lasers With Reduced Hot Carrier Effects".

R. Kumar et al., Appl. Phys. Lett., vol. 67, No. 26, pp. 3704–3706, 1996, "A Quantum Structure For High–Temperature Operation Of AlGaAs Lasers: Multiple–Quantum Barrier And Multiple–Quantum Well In Active Region".

P. M. Smowton et al., Appl. Phys. Lett., vol., 67, No. 28, pp. 1265–1267, 1995, "Threshold Current Temperature Dependence Of $GaInP/AlyGa_{1-y})InP$ 670 nm Quantum Well Lasers".

*Primary Examiner*—Brian Healy

[57] ABSTRACT

A separate confinement heterostructure (SCH) laser device (LD) has: a quantum well active region within an optical guiding region; and, n-type and p-type cladding regions provided on opposite sides of the optical guiding region. An electron-capture layer is provided in the n-side portion of the optical guiding region. The composition of the electron-capture layer is set in such a manner that the minimum energy for X-electrons in the conduction band is lower than that in the surrounding parts of the active region and/or the n-side portion of the optical guiding region. The electron-capture layer is thick enough to bind X-electrons so that, in use, the electron-capture layer promotes the capture of the X-electrons. The electron-capture layer is disposed sufficiently close to the active region to permit transfer ot the captured X-electrons to at least one Γ-confined level in the active region.

45 Claims, 20 Drawing Sheets

LASER DEVICES INCLUDING SEPARATE CONFINEMENT HETEROSTRUCTURE

BACKGROUND OF THE INVENTION

The invention relates to the field of semiconductor laser devices of both the edge emitting and surface emitting types and is particularly concerned with separate confinement heterostructure (SCH) laser devices (LDs).

LDs emitting in the visible spectral region around 650 nm are key elements in the latest professional and consumer products based on Digital Video Discs (DVDs). The most important semiconductor material for such diodes is the AlGaInP alloy system and optical devices based on these materials are already well developed.

The limiting feature of the AlGaInP alloy system for visible laser diode production is the relatively small conduction and valence band offset between the constituent semiconductors in a heterostucture laser. For instance, the maximum conduction band offset obtained in $(AlGa)_{0.5}In_{0.5}P$ is only 270 meV compared to 350 meV in the GaAs/AlGaAs case. Consequently, there is a significant thermally activated electron leakage current in these diodes, leading to high laser threshold currents and poor temperature characteristics. The loss of holes towards the n-type contact, though less significant than electron loss, is also a contributing factor.

A number of approaches have been taken to improve this limitation, notably an increased p-type doping in the p-type cladding region of the LD and the use of so-called Multiple Quantum Barriers (MQBS) near the p-type cladding region (see, for example, D. P. Bour et al, IEEE J. Quant. Elect., vol 30, 2, pp 593–606 (1994)). Both approaches attempt to reduce the electron leakage current by presenting an increased potential barrier to electrons thermally excited out of the active region of the LD, and swept towards the p-type contact by the applied electric field.

Two approaches can be taken to increase the relative population of carriers (electrons and holes) radiatively combining in the active region (and hence contributing to lasing) to those lost by thermal excitation into the p-type contact or recombining non-radiatively in the cladding regions. Inclusion of barrier layers, such as MQBs or electron-reflecting layers, attempt to decrease the leakage current in devices by preventing the loss of electrons (or holes in the case of hole barrier layers).

A second approach is to increase the efficiency of electron capture into the active region of the device. In P. Bhattacharya et al, IEEE J. Quant Elect., vol. 32, 9, pp 1620–1629 (1996), the capture of electrons is promoted by employing a tunnelling region by which high energy injected electrons are cooled before capture into quantum well active regions. This decreases the effect of hot carriers in the wells and also limits the loss of high energy electrons traversing the active region without being captured by the wells, as illustrated in accompanying FIG. 1 which is a schematic diagram illustrating the valence and conduction band energies of a resonant-tunnelling injection LD. In FIG. 1, active region 10 is within an optical guiding region 12 consisting of an n-side guiding region 12a and a p-side guiding region 12b. N-type and p-type cladding regions 14 and 16, respectively, are provided on opposite sides of the active region 10 and guiding regions 12a and 12b. The n-side guiding region 12a is wide and comprises a portion 12c remote from active region 10. The portion 12c has a lower bandgap energy than the region 12b, but there is also provided resonant tunnel barrier region 12d in the n-side guiding region 12a. Electrons from the cladding region 14 are confined in the guiding region 12c by the energy barriers defied by cladding region 14 and the resonant tunnel barrier region 12d. High energy ("hot") electrons cool down in the region 12c by losing energy. Low energy ("cold") electrons in the region 12c are injected into the active region 10 by resonant tunnelling through the quantum confined energy level in region 12d. Holes from the p-type cladding region 16 reach the active region 10 by traversing the p-side guiding region 12b without tunnelling.

R. Kumar et al, Appl. Phys. Lett 68, 26, pp 3704–3706 (1996) disclose the provision of an MQB at the centre of the quantum well active region of an AlGaAs laser in order to promote the capture of injected holes. An MQB in the p-type cladding region is designed to reflect electrons towards the quantum well active region, but this has the unwanted effect of reflecting holes away from the active region. Placing an MQB in the centre of the active region is designed to overcome this problem.

P. M. Smowton et al in Appl. Phys. Lett., vol. 67, pages 1265–1267, 1995 show that an important leakage mechanism for electrons can be via the indirect X-valley of the conduction bands in the p-side guiding and cladding regions of a separate confinement heterostructure (SCH) laser having two $Ga_{0.41}In_{0.59}P$ quantum wells separated by a barrier, all set in an optical guiding region of $(Al_yGa_{1-y})_{0.51}In_{0.49}P$ (where y is variously 0.3, 0.4 and 0.5), and clad with $(Al_{0.7}Ga_{0.3})_{0.51}In_{0.49}P$ cladding regions doped with Zn on the p-side and Si on the n-side. However, no proposals are made for mitigating the problems caused by loss of electrons via this mechanism.

Accompanying FIG. 2 shows the band offsets for lattice matched (AlGa)InP. The minimum energy in the conduction band of AlGaInP is a finction of aluminium content, with a crossover from a Γ-band minimum to an X-band minimum at a concentration of 0.55. The terms Γ-band and X-band as used herein refer to symmetry points in the Brillouin zone and are standard terms in solid state physics, see for example R. A. Smith, "Semiconductors", (Cambridge University Press, 1978). The terms Γ-minimum and X-minimum refer to the minimum energy level of the Γ-band and the X-band, respectively.

Accompanying FIG. 3 illustrates the conduction and valence band profiles of a typical InGaP/AlInGaP multi-quantum well laser showing the relative positions of the Γ- and X-minima in the heterostructure layers. In FIG. 3, active region 10 has three quantum energy wells formed of $Ga_{0.5}In_{0.5}P$ set in optical guiding region 12. N-side and p-side guiding regions 12a and 12b are formed of $(Al_{0.5}Ga_{0.5})_{0.5}In_{0.5}P$. N-type and p-type cladding regions 14 and 16 are formed of respectively n- and p-doped $(Al_{0.5}Ga_{0.5})_{0.5}In_{0.5}P$.

Optical transitions giving rise to laser action in the active quantum well region 10 of the laser diode originate from Γ-electrons in the InGaP quantum wells. FIG. 3 indicates that, in many layers, the X-minimum is of the same or lower energy than the Γ-minimum. As noted by Smowton et al (supra), a significant percentage of the injected electron population, as well as thermally activated leakage electrons, reside in the X-valley of the AlGaInP cladding, guiding and barrier regions of the laser diode.

As can be seen from FIG. 3, near the p-type cladding region 16, there is a low energy transport path via the X-minima with a lower activation energy for thermal loss of electrons from the wells of the active region to the X-bands than to the corresponding Γ-bands in the guiding region 12b and cladding region 16.

SUMMARY OF THE INVENTION

The present invention is based on the discovery that the X-minima in the guiding and cladding regions 12a and 14 on the n-side of a heterostructure LD are also significant in the injection of electrons from the n-type contacts into the active quantum well region 10. Since the X-minimum in InGaP is energetically higher than the Γ-minimum (whereas these minima are almost degenerate in $(AlGa)_{0.5}In_{0.5}P$), FIG. 3 shows that the active region 10 consists of a set of quantum wells for Γ-electrons but a set of quantum barriers for X-electrons. Thus, electrons injected from the n-type cladding region 14, transported through the X-minimum of the AlGaiP guiding region 12a, are presented with a barrier at the guiding region/quantum well interface. A significant proportion of those electrons are thus reflected back into the guiding region 12a where they may recombine non-radiatively. They do not therefore contribute to the carrier population in the quantum wells and hence increase the threshold current of the laser.

It is an object of the present invention to provide an SCH LD in which the loss of electrons to non-radiative recombination paths in the guiding region is reduced and the capture of electrons into the active region (where they contribute to lasing) is increased, whereby to lower the laser threshold current required to achieve lasing.

According to the present invention, there is provided a separate confinement heterostructure (SCH) laser device (LD) comprising:

an optical guiding region;
an active region having at least one energy well, said active region being disposed in said optical guiding region; and
n- and p-type cladding regions on opposite sides of said optical guiding region;
wherein
(1) an electron-capture layer is provided in the active region or in a part of the optical guiding region which is disposed between the active region and the n-type cladding region;
(2) the composition of the electron-capture layer is such that the X-minimum in such layer is lower than that in adjacent parts of the heterostructure;
(3) the electron-capture layer is thick enough to bind X-electrons so that, in use, the electron-capture layer promotes the capture of X-electrons; and
(4) the electron-capture layer is sufficiently close to the active region to permit transfer of captured X-electrons to at least one Γ-confined level in the active region so that X-electrons do not remain in the electron-capture layer indefinitely and the electron-capture layer acts as a conduit for transfer of X-electrons into said at least one energy well in the active region.

The electron-capture layer may be thin enough (e.g. about 2 to 30 Å, and more preferably 8 to 25 Å, and conveniently about 15 Å) to allow tunnelling of Γ-electrons therethrough so that the capture of Γ-electrons into the active layer is substantially uninhibited. As an alternative, it is possible to arrange for the electron-capture layer to be thick enough (e.g. about 50 to 200 Å, and more preferably up to about 50 to 100 Å) to reflect Γ-electrons so that they relax in energy and enter said at least one energy well in the active region via an intermediate X-state in the electron-capture layer.

The electron-capture layer has a composition in which the content of a substitutional element (e.g. Al in the case of the (AlGa)InP alloy material) is greater than in the guiding region. The substitutional element content of such layer is conveniently substantially the same as that of the n-type cladding region, but it can be greater or smaller.

In a first embodiment, the electron-capture layer is disposed in the n-side guiding region directly adjacent the active region. In this case, the X-minimum in such layer is lower than that in each of the adjacent part of the active region and the adjacent part of the n-side guiding region.

In a particular example, the technique of growth interruption may be employed at the interface between the electron-capture layer and an energy well of the active region. This is a known technique in epitaxial growth wherein the growth of semiconductor layers is interrupted or paused for several seconds or minutes before the following layer is deposited. This has the effect of altering the interface structure between adjacent layers and, in the present invention, can affect the transfer of X-electrons from the capture layer to the well.

In a second embodiment, the electron-capture layer is disposed in the n-side guiding region and is spaced from the active region by a distance which is thin enough (typically several angstroms) to allow sufficient transfer of bound X-electrons from the electron-capture layer to the Γ-states in the energy well. In this case, the X-minimum in such layer is lower than that in each of the adjacent parts of the n-side guiding region on opposite sides of the layer.

The composition and thickness of the electron-capture layer is chosen to increase the capture efficiency of X-electrons and also serves to inhibit the thermally activated leakage of holes from the active region to the n-type cladding region. By virtue of the electronic structure of the semiconductor materials considered here, the maximum energy of the valence band is always at the Γ-point and the electron-capture layer always acts as a barrier for holes. It is preferred to optimise the electron-capture layer for reduction of the leakage of holes. In this respect, it is to be appreciated that to prevent hole leakage the layer should be as thick as possible, but a thick layer will inhibit electron-capture, hence optimisation is required to balance these different effects.

In a third embodiment, in an SCH LD having first and second quantum energy wells in the active region, the electron-capture layer is provided in the active region and constitutes a barrier material between the first and second quantum wells. In this case, the X-minimum in such electron-capture layer is lower than that in each of the adjacent parts of the active region on opposite sides of the layer. If the active region has more than two quantum wells, an additional electron-capture layer or layers may be provided accordingly. The provision of such barrier material(s) between the quantum wells means that the Γ-electrons need to have an increased energy to escape from the quantum wells to the Γ-minimum in the barrier material(s). Such layers also have the effect of increasing the activation energy of X-electrons in the barrier layers to that of X-electrons in the quantum wells. In other words, the relatively high energy X-minimum of the quantum well material causes the well material itself to act as a barrier to any X-electrons which may find their way into the barrier material(s).

In an alternative embodiment, an electron-capture layer of the above-described type is provided on each side of the active region to enable X-electrons to be trapped near the active region where they may relax into said at least one energy well in the active region. Most preferably, the electron-capture layers are disposed substantially symmetrically relative to the active region and are of substantially the same composition and thickness. This can enable the optical mode of the emitted laser light to be improved by increasing the symmetry of the refractive index profile of the optical guiding region.

The SCH LD according to the present invention may also incorporate any of the above-described per se known measures for decreasing the leakage current by presenting increased energy barriers on the p-side of the LD designed to reflect thermally activated carriers back into the active region.

However, it is preferred to decrease the leakage current by providing an electron-reflecting barrier layer in a p-side region of the LD, wherein (a) the composition of said barrier layer is such that it has an X-minimum which is higher than that in an adjacent part of the p-side region at least on that side of the barrier layer which is disposed between the barrier layer and said active region, and (b) the thickness of said barrier layer is such as to prevent electron tunnelling between the X-bands of adjacent parts of the p-side region on opposite sides of the barrier layer, and/or parts of the p-side region on opposite sides of the barrier layer have compositions which are sufficiently different from one another to prevent such tunnelling.

The barrier layer may be provided in the p-type cladding region or in the p-side optical guiding region. If there is more than one such barrier layer, the additional barrier layer(s) may be provided in either or both of such regions. At least one barrier layer, however, is preferably provided within the p-type cladding region, and (a) the composition of said barrier layer is such that the X-minimum therein is higher than that in an adjacent part of the p-type cladding region at least on that side of the barrier layer which is disposed between the barrier layer and said optical guiding region, (b) the composition and/or thickness of said barrier layer is such that it has a Γ-minimum which is higher than the X-minimum of said adjacent part of the p-type cladding region, and (c) the thickness of said barrier layer is such as to prevent electron tunnelling between the X-bands of the adjacent parts of said p-type cladding region on opposite sides of the barrier layer, and/or the adjacent parts of said p-type cladding region on opposite sides of the barrier layer have compositions which are sufficiently different from one another to prevent such tunnelling.

Preferably, (a) the composition of said barrier layer is such that the X-minimum therein is higher than that of adjacent parts of the p-type cladding region on both sides of the barrier layer; (b) the composition and/or thickness of said barrier layer is such that it has a Γ-minimum which is higher than the X-minima of the adjacent parts of the p-type cladding region on opposite sides of the barrier layer; and (c) the thickness of said barrier layer is such as to prevent electron tunnelling between the X-bands of said adjacent parts of said cladding region, and/or the adjacent parts of said p-type cladding region on opposite sides of the barrier layer have compositions which are sufficiently different from one another to prevent such tunnelling.

In the case where the barrier layer is in the p-side guiding region, it preferably has a composition such that the X-minimum therein is higher than that the p-type cladding region.

The barrier layer preferably has substantially the same composition as that of the active region.

The effect of said barrier layer is to act as a barrier to electrons travelling in the X-valley (i.e. relatively lower energy level X-electrons) and thus reflect them back towards the active region and prevent their drift and diffusion in the p-type cladding region. It is considered possible to block some of the electron leakage using just a single barrier layer, thus making it easier to implement than the above-mentioned MQB which, in contrast to the single layer, relies on quantum mechanical coherence of the states for its reflecting power.

The thickness of the barrier layer is most preferably chosen such that the first confined electron state (e') therein lies above those of the X-minima in the adjacent cladding and guiding regions. With e' in this energy position, there is no state of lower energy into which electrons could thermalise and subsequently recombine. Typically, the thickness of the barrier layer is 20 Å to 3 Å, and is preferably 15 Å to 7 Å.

Preferably, the thickness of that part of the p-type cladding region which is disposed between the barrier layer and the optical guiding region is not less than 100 Å, and more preferably is in the range of 100 Å to 1 mm. This assists in sing (1) thermal escape of carriers from the cladding region over the barrier provided by the barrier layer, and (2) tunnelling of carriers through the barrier layer. This is because, if the carriers in this part of the cladding region have thermalised to the bottom of the X-band, they will have the maximum barrier to surmount and the maximum barrier to tunnel through.

In another embodiment involving electron reflection, at least one additional barrier layer is provided. Preferably, the thicknesses of the barrier and said at least one additional barrier layers decrease away from the guiding region. This provides a plurality of e' levels which rise into the p-type cladding region from the guiding region so as to provide an increasing tunnel barrier to electrons.

The separation between adjacent barrier layers is preferably not less than 2.85 Å and is preferably 7 Å to 15 Å. The material separating adjacent barrier layers preferably has substantially the same composition as that of the p-type cladding region.

The SCH LD may be an edge-emitting LD or a surface emitting LD. The SCH LD may be based on the alloy system (i) (InGa)P/(AlGaIn)P or on the alloy system (ii) GaAs/(AlGa)As.

The alloy system (i) is preferably the alloy system:

$(In_xGa_{1-x})P/(Al_yGa_{1-y})_zIn_{1-z}P$ where $0.3 \leq x \leq 0.6$, y is in the range 0 to 1, and z is in the range of 0.3 to 0.6. Preferably, z in the alloy system (i) is 0.515 because this is the composition at which it is lattice-matched with a GaAs substrate.

The alloy system (ii) is preferably $GaAs/(Al_xGa_{1-x})As$ where x is in the range of 0.1 to 1.

It is to be appreciated that the values of x and y in the alloy systems (i) and (ii) above depend upon the composition of the parts of the p-side region which are adjacent to the electron-reflecting barrier layer.

In all of the above embodiments, it is within the scope of the present invention for the laser diode to be of the Graded Refractive Index Separate Confinement Heterostructure (GRINSCH) type.

The LD may be of the edge-emitting type or of the surface-emitting type.

BRIEF DESCRIPTION OF THE DRAWINGS

In the accompanying drawings.

DETAILED DESCRIPTION OF THE INVENTION

Figure 4:
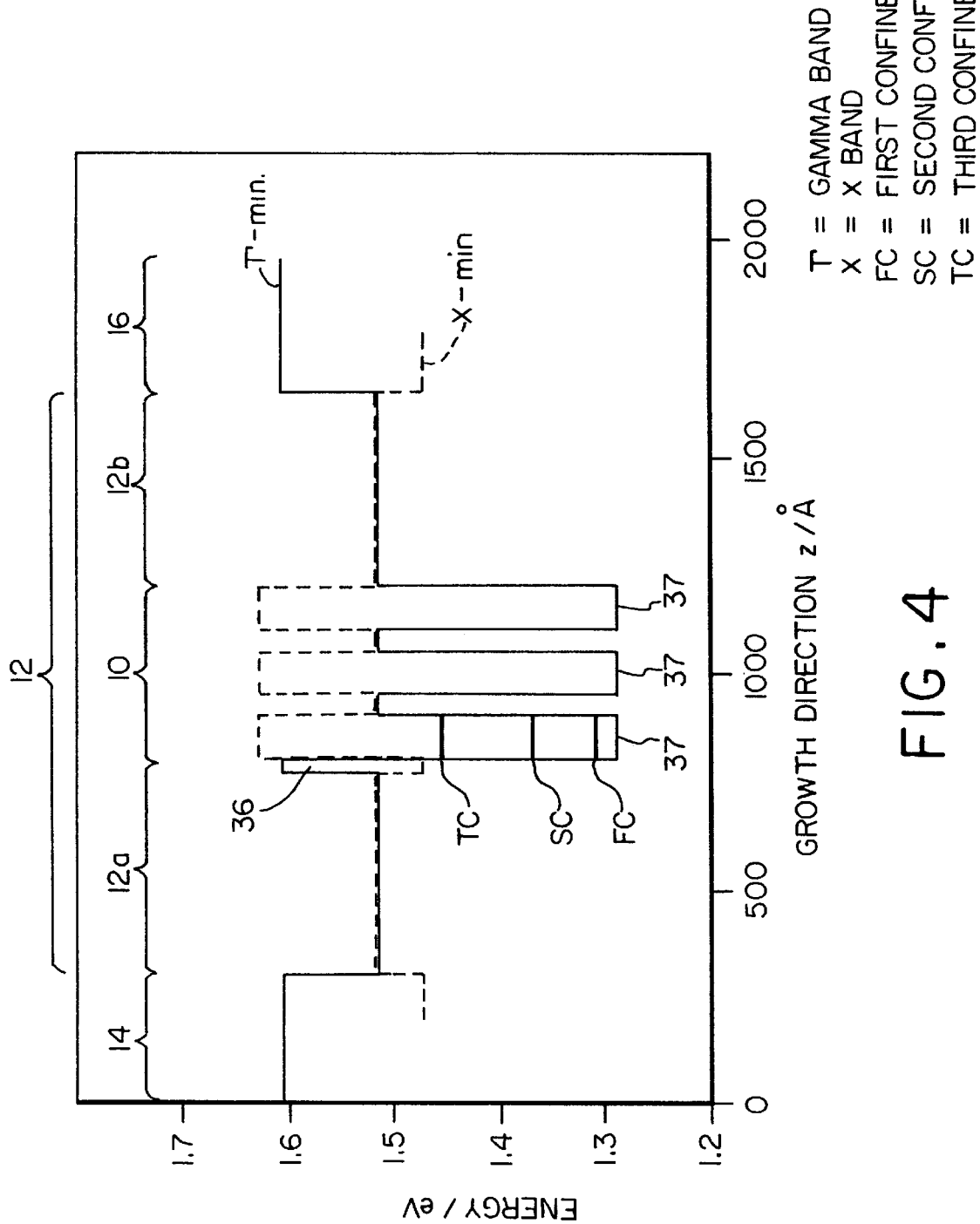
FIG. 4 is a schematic view similar to FIG. 3, of the conduction band profile of a first embodiment of SCH LD including an electron-capture layer according to the present invention.

Referring now to FIG. 4, the SCH LD is of the type described previously and basically comprises active region 10 within optical guiding region 12 formed of n-side guiding region 12a and p-side guiding region 12b, with n-type and p-type cladding regions 14 and 16 disposed on opposite sides of the optical guiding region 12. In this embodiment, the active region 10 is a multi-quantum well active region where the quantum wells 37 are formed of $Ga_{0.5}In_{0.5}P$ separated by active region barriers formed of the same alloys as that of the optical guiding region 12, namely $(Al_{0.5}Ga_{0.5})_{0.5}In_{0.5}P$. The n-type cladding region 14 is formed of $(Al_{0.7}Ga_{0.3})_{0.5}In_{0.5}P$ doped with n-type doping atoms, whilst the p-type cladding region 16 is formed of the same alloy as the region 14 but doped with p-type doping atoms.

In accordance with the present invention, an electon-capture layer 36 is provided in the n-side guiding region 12a directly adjacent to one of the quantum wells of the active region 10. In this embodiment, the layer 36 has the same basic alloy composition as the cladding regions 14 and 16, namely $(Al_{0.7}Ga_{0.3})_{0.5}In_{0.5}P$. This composition of the layer 36 has an X-minimum which is lower in energy than the corresponding X-minima in the adjacent parts of the n-type guiding region 12a and the adjacent quantum well in the active region 10. The layer 36 typically has a thickness of about 15 Å. The thickness is sufficient to allow for efficient binding of X-state injected electrons into the layer 36 but is sufficiently thin to enable adequate tunnelling of Γ-electrons through the layer 36 into the adjacent quantum well so as not to inhibit capture of such electrons.

Figure 5:
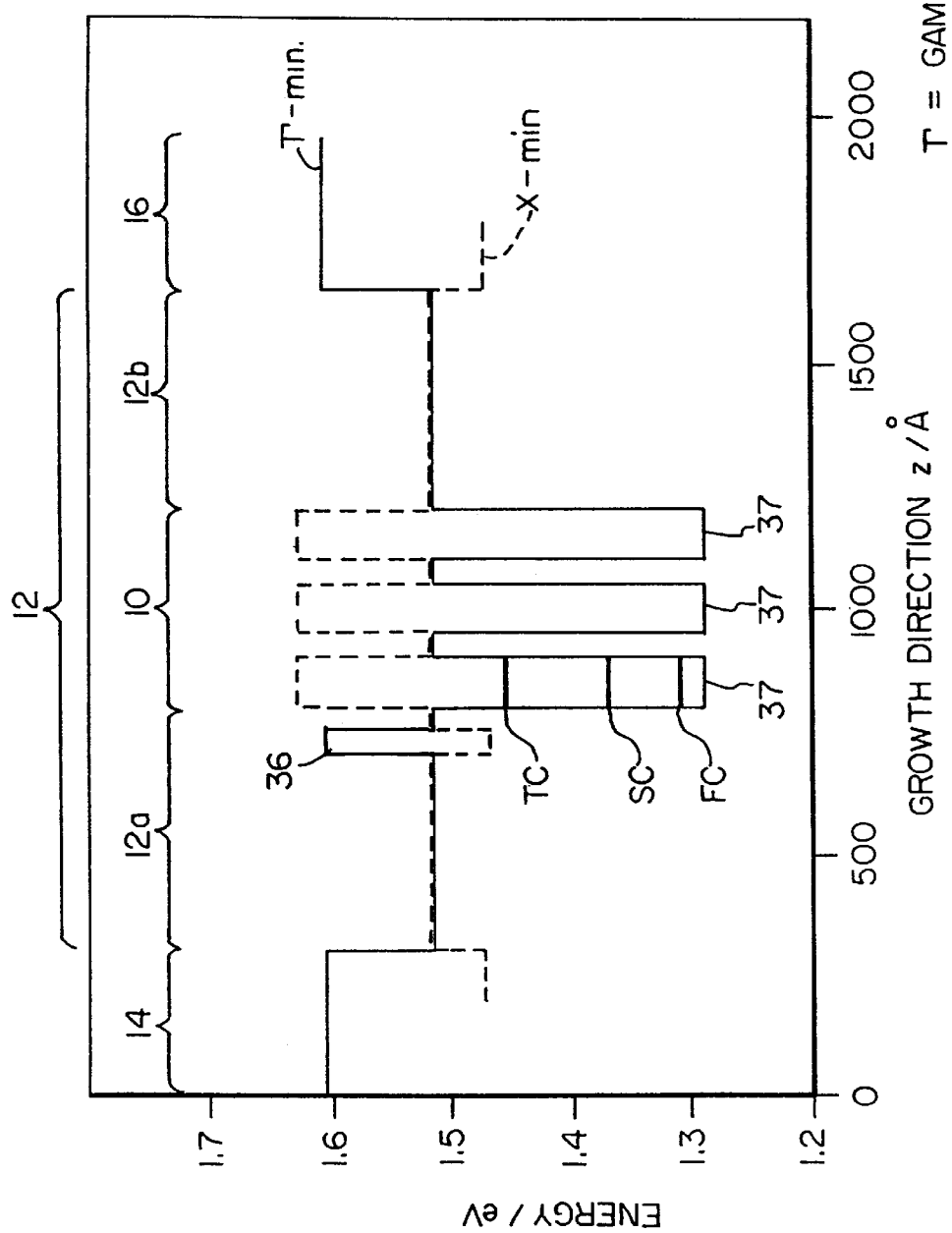
FIG. 5 shows the conduction band profile of a second embodiment of SCH LD according to the present invention.

In the embodiment illustrated in FIG. 5, the device is the same as that of FIG. 4 except that the electron-capture layer 36 is spaced from the nearest quantum well 37 of the active region 10 by several Å, which is small enough to allow sufficient transfer of bound X-electrons from the layer 36 to the Γ-states (TC, SC, FC) in the quantum well (a spacing of greater than 50 Å will effectively prevent any such transfer).

Figure 6:
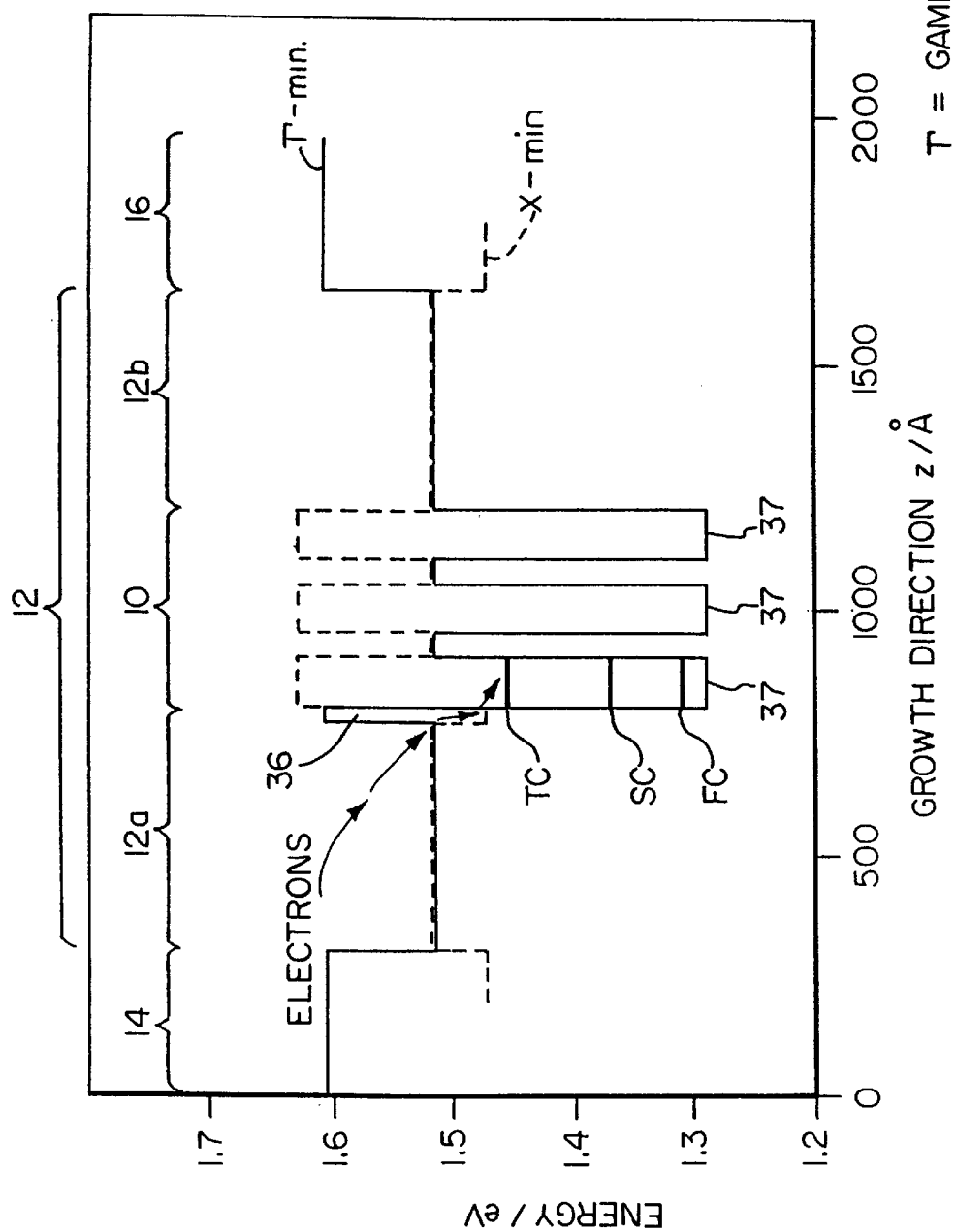
FIG. 6 shows the conduction band profile of another embodiment of SCH LD according to the present invention.

Referring now to FIG. 6, in this embodiment, the arrangement is as described with reference to FIG. 4, except that, in this embodiment, the thickness of the electron-capture layer 36 is optimised such that high energy Γ-electrons do not tunnel through the layer 36 but are instead reflected from the layer 36. For this reason, the layer 36 has a thickness of about 50 Å. Such high energy Γ-electrons which have been reflected then relax in energy and enter the quantum well active region 10 via the intermediate X-state in the layer 36, as can be seen from the arrows in FIG. 6. It is to be understood that the difference between the effect described here and the tunnelling injection described by Bhattacharya et al (supra) is that there is no involvement of X-levels in the latter, nor is there any resonant tunnelling effect in the LDs of the present invention.

Figure 7:
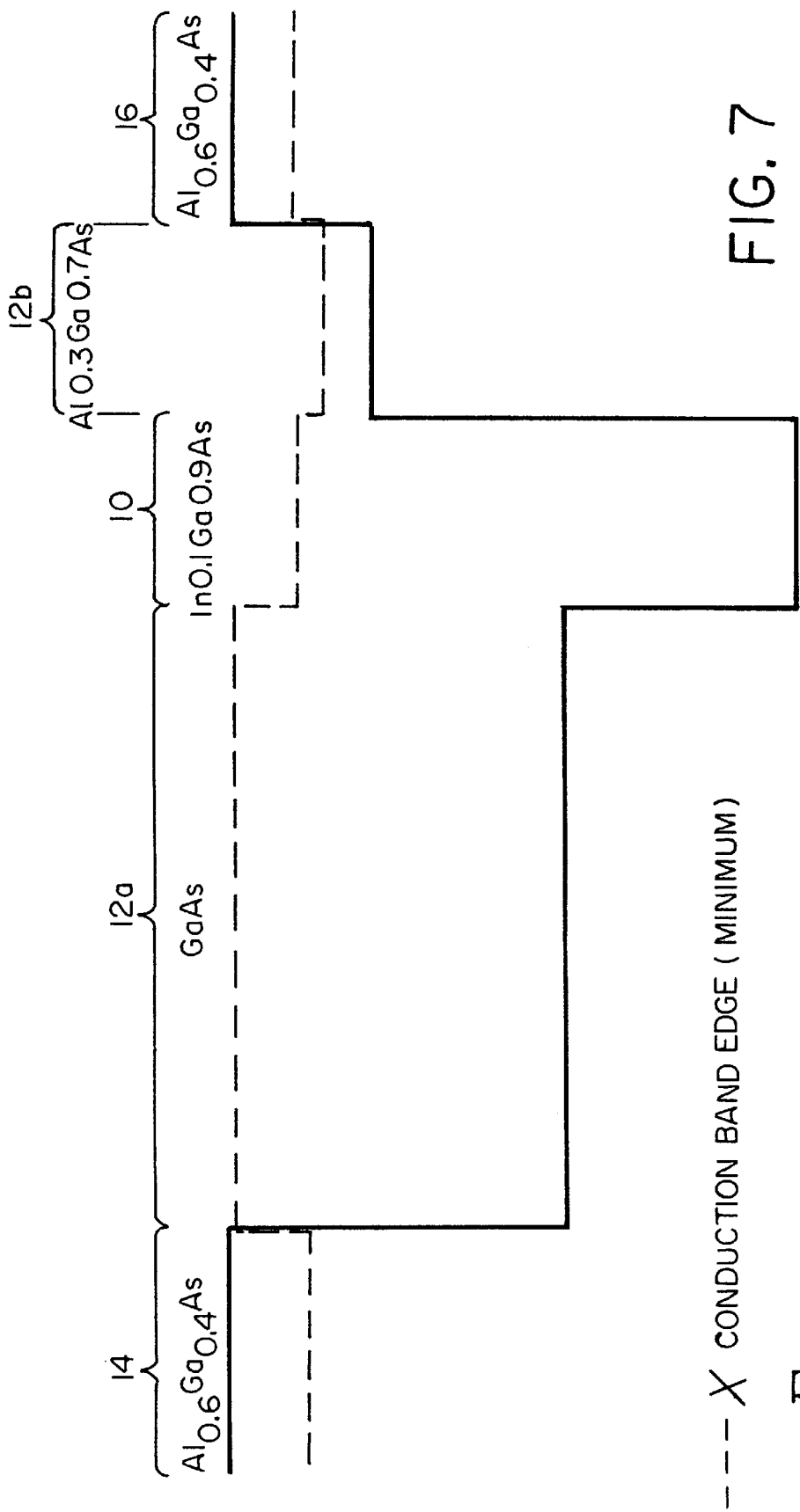
FIG. 7 is a schematic view of the conduction band profile of a particular form of the resonant tunnelling injection LD illustrated in FIG. 1 (but with the tunnelling layers removed), to demonstrate that, in this case, there is no barrier to X-electrons being captured into the quantum well region.

This will be apparent by reference to accompanying FIG. 7 which shows that the active region 10 is a quantum well for both Γ-state and X-electrons. FIG. 7 shows the situation for the example given in Table 1 of Bhattacharya et al (supra) where the two resonant tunnelling barriers (not shown in FIG. 7) are each 20 Å thick and are formed of AlAs and separated by a tunnelling well (also not shown in FIG. 7) which has a thickness of 40 Å and which is formed of $In_{0.10}Ga_{0.90}As$. Such an arrangement is provided between (i) an active region having an active quantum well which is 80

Å wide and which is formed of the same material as the tunnelling well, and (ii) an n-side guiding region having a thickness of 0.1 mm formed of GaAs; and where a p-side guiding region is formed of $Al_{0.30}Ga_{0.70}As$, and n-type and p-type cladding regions are formed of repespectively doped $Al_{0.6}Ga_{0.4}As$.

Figure 1:
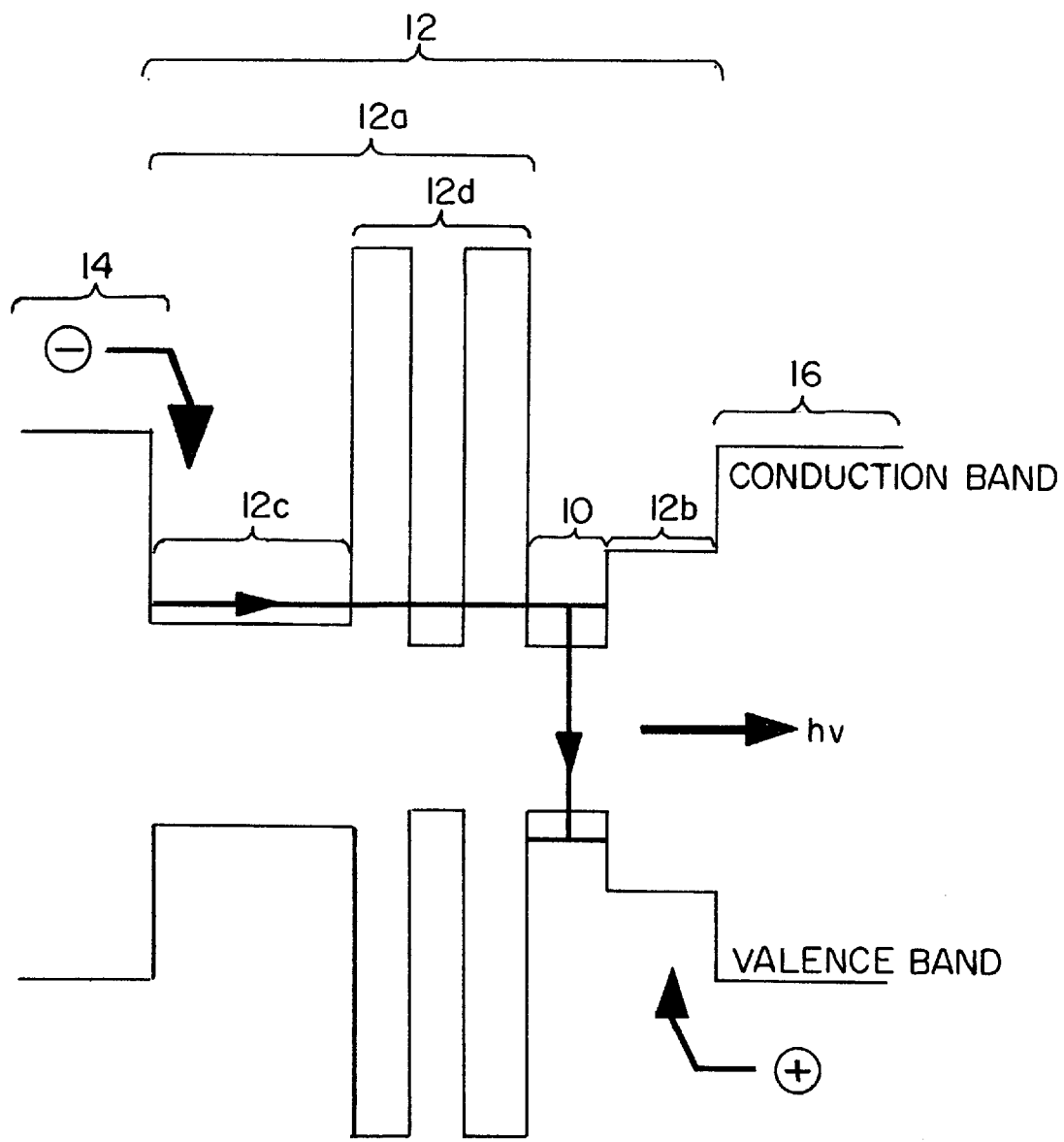
FIG. 1 is a schematic illustration of the conduction and valence bands in a known resonant tunnelling injection LD, as described above.
Figure 2:
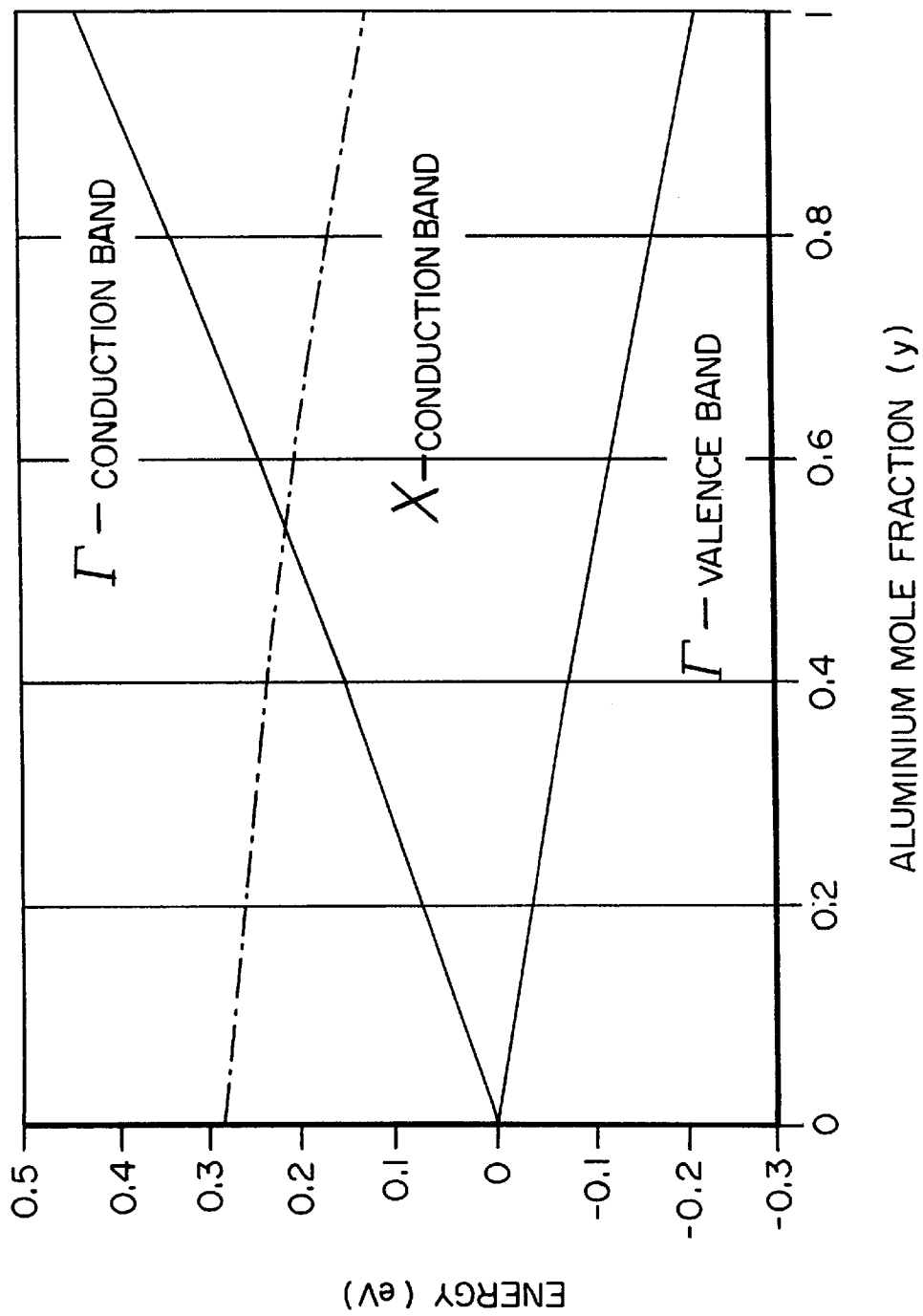
FIG. 2 is a schematic diagram indicating the relative positions of the conduction and valence band edges for the $(InGa)P/(Al_yGa_{1-y})_{0.52}In_{0.48}P$ alloy system, as described above.
Figure 3:
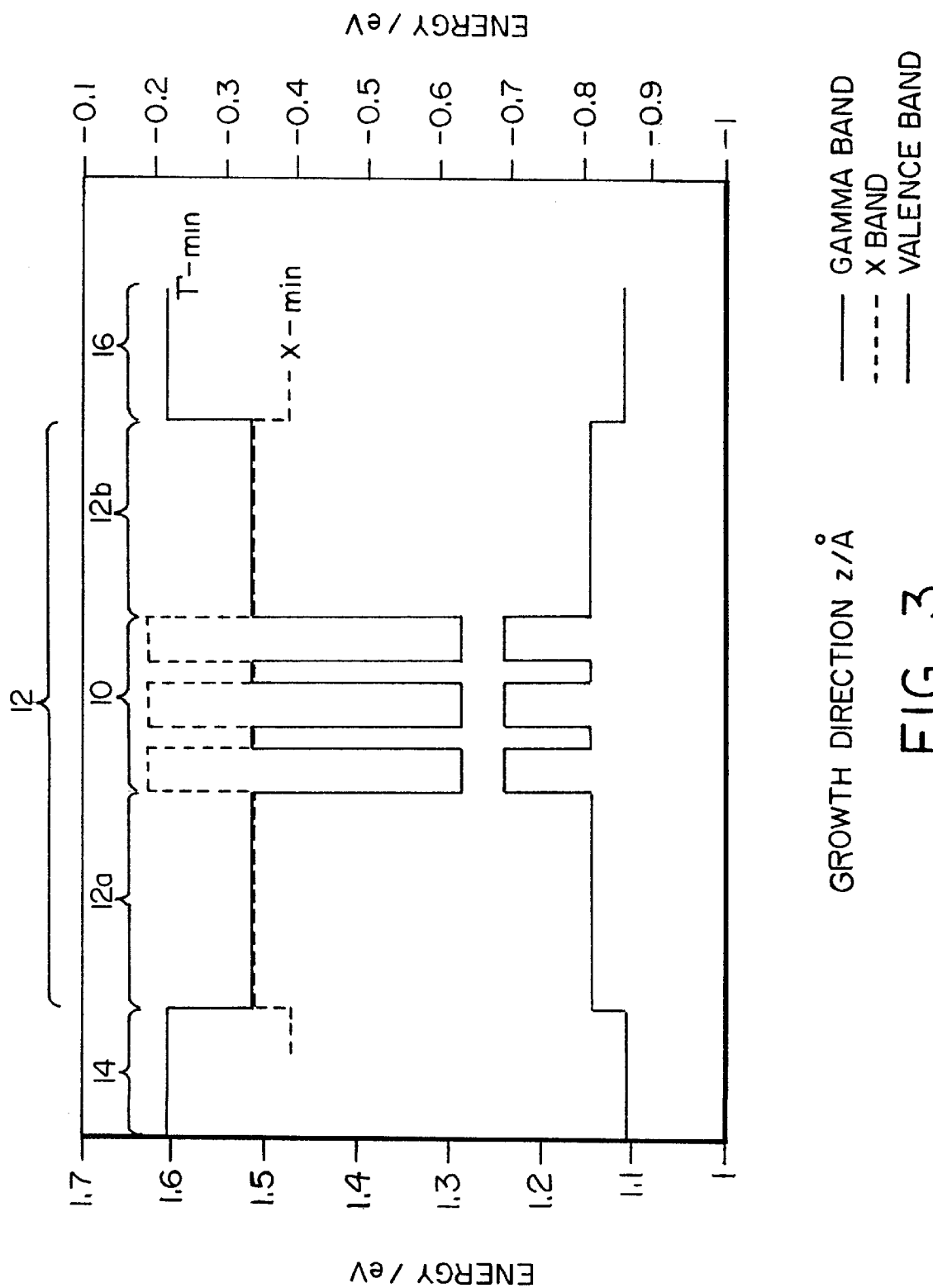
FIG. 3 is a schematic diagram of the conduction band edges for Γ-electrons and X-electrons and the valence band edge for Γ-electrons in a typical (AlGa)Inp/GaInP multi-quantum well LD, as described above.
Figure 8:
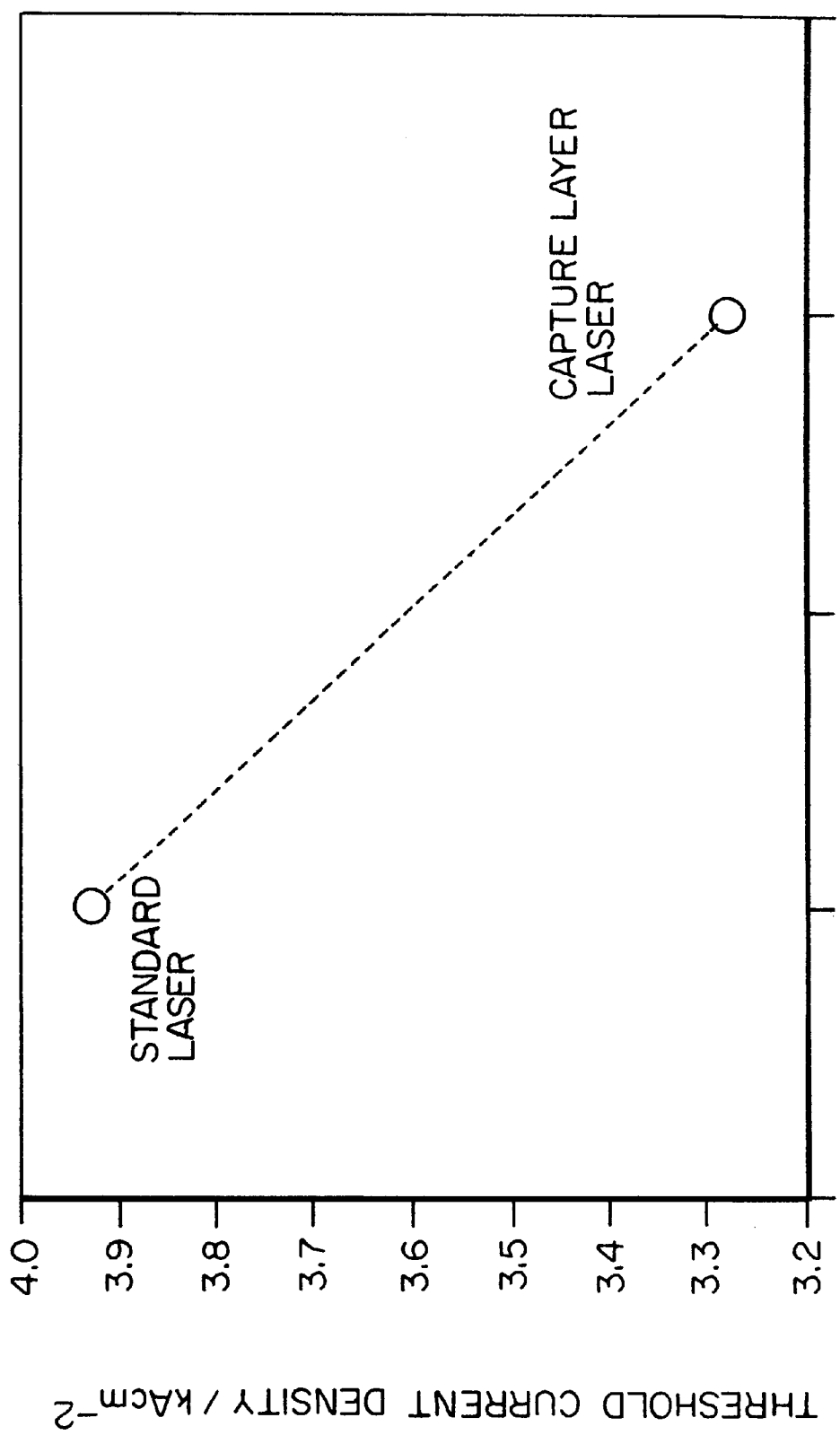
FIG. 8 is a graph showing an experimental comparison of threshold current densities of (AlGaIn)P lasers with and without an electron-capture layer according to the present invention.

Referring now to FIG. 8, there are shown the threshold current densities of so-called Broad Area lasers operating under pulsed electrical injection. These are terms that would be familiar to anyone skilled in the production and testing of laser diode devices. Illustrated are results on a so-called "Standard Laser" similar to that shown in FIG. 3. The Standard Laser has been produced using an epitaxial growth technique known as Gas Source Molecular Beam Epitaxy (GSMBE), but it could have been fabricated using any alternative epitaxial growth method such as Solid Source Molecular Beam Epitaxy (SSMBE) or Metal Organic Vapour Phase Epitaxy (MOVPE). In the Standard Laser, the n-and p-type cladding regions 14 and 16 are of $(Al_{0.7}Ga_{0.3})_{0.515}In_{0.485}P$, the optical guiding region 12 is of $(Al_{0.5}Ga_{0.5})_{0.5}In_{0.5}P$ and surrounds an active region 12 having three quantum wells of composition $Ga_{0.515}In_{0.485}P$ and 100 Å thickness separated by barriers of $(Al_{0.5}Ga_{0.5})_{0.515}In_{0.485}P$.

The "Capture Layer Laser" is identical in structure to the "Standard Laser" apart from that addition a 15 Å thick electron-capture layer 36 of $(Al_{0.7}Ga_{0.3})_{0.515}In_{0.485}P$ situated in the n-side guiding region 12a adjacent to the active region 10 as described above with reference to FIG. 4.

As can be seen from FIG. 8, the threshold current density for the Capture Layer Laser, which is in accordance with the present invention, is approximately 17% less than that of the "Standard Laser".

Figure 9:
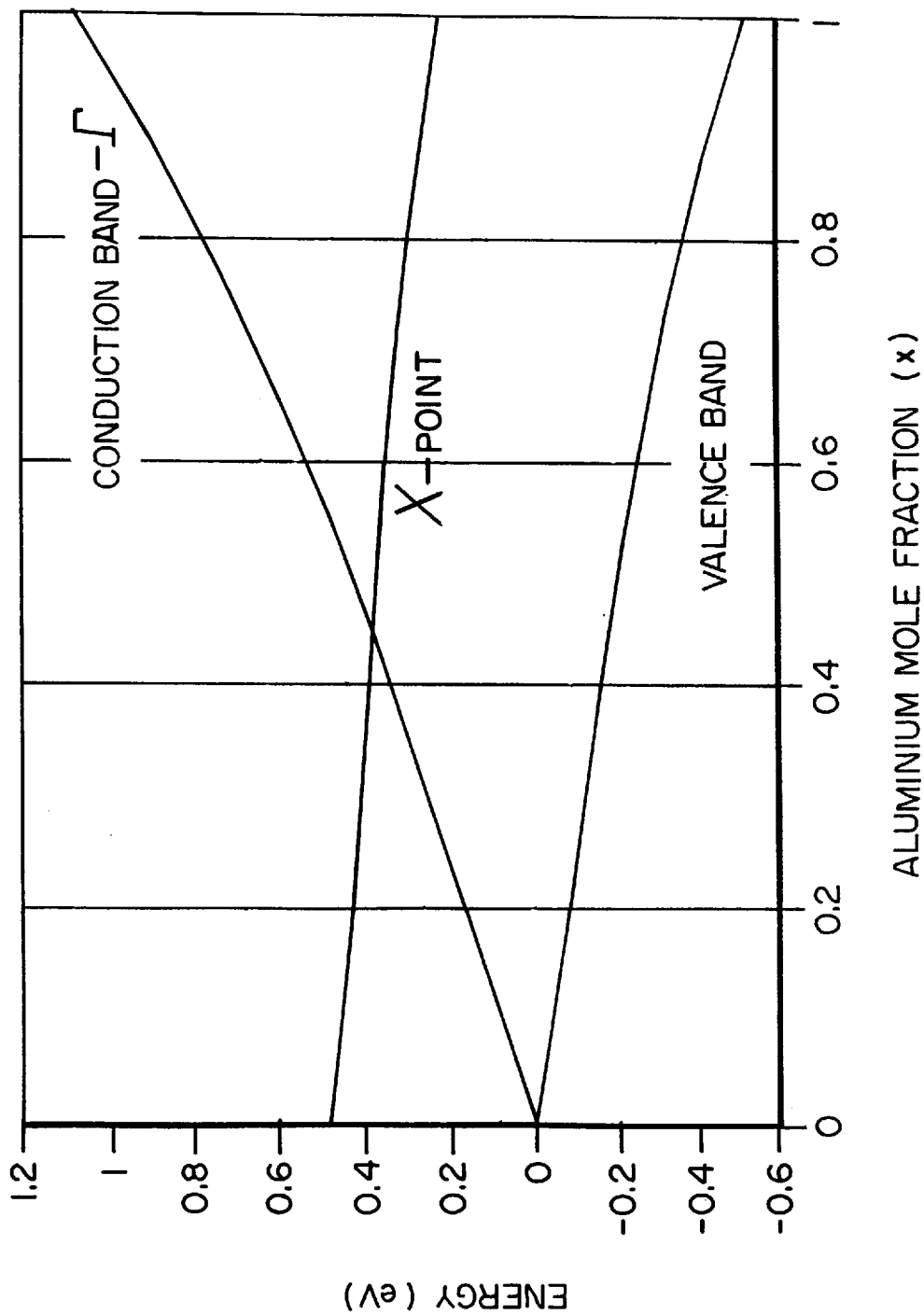
FIG. 9 is a diagram similar to that of FIG. 2 but showing the relative positions of the conduction and valence band edges for the $GaAs/(Al_xGa_{1-x})As$ alloy system.

The present invention is applicable to the provision of at least one electron-capture layer into any suitable semiconductor material system in which there are several conduction band minima. These minima have compositional dependent energies such that, for particular semiconductor compositions, indirect valley minima (X-valley or L-valley, the latter being another conduction band minimum) are lower than the Γ-minimum, then a heterostructure composed of such semiconductors can exhibit the type of band alignment shown in FIG. 3 referred to above. In such cases, the use of at least one electron capture layer in accordance with the teachings of the present invention will improve the characteristics of lasers made from these semiconductors. An example of such a system is AlGaAs where the conduction band mum changes from Γ-type to X-type at an aluminium concentration of approximately 0.55. This is shown in accompanying FIG. 9.

Figure 10:
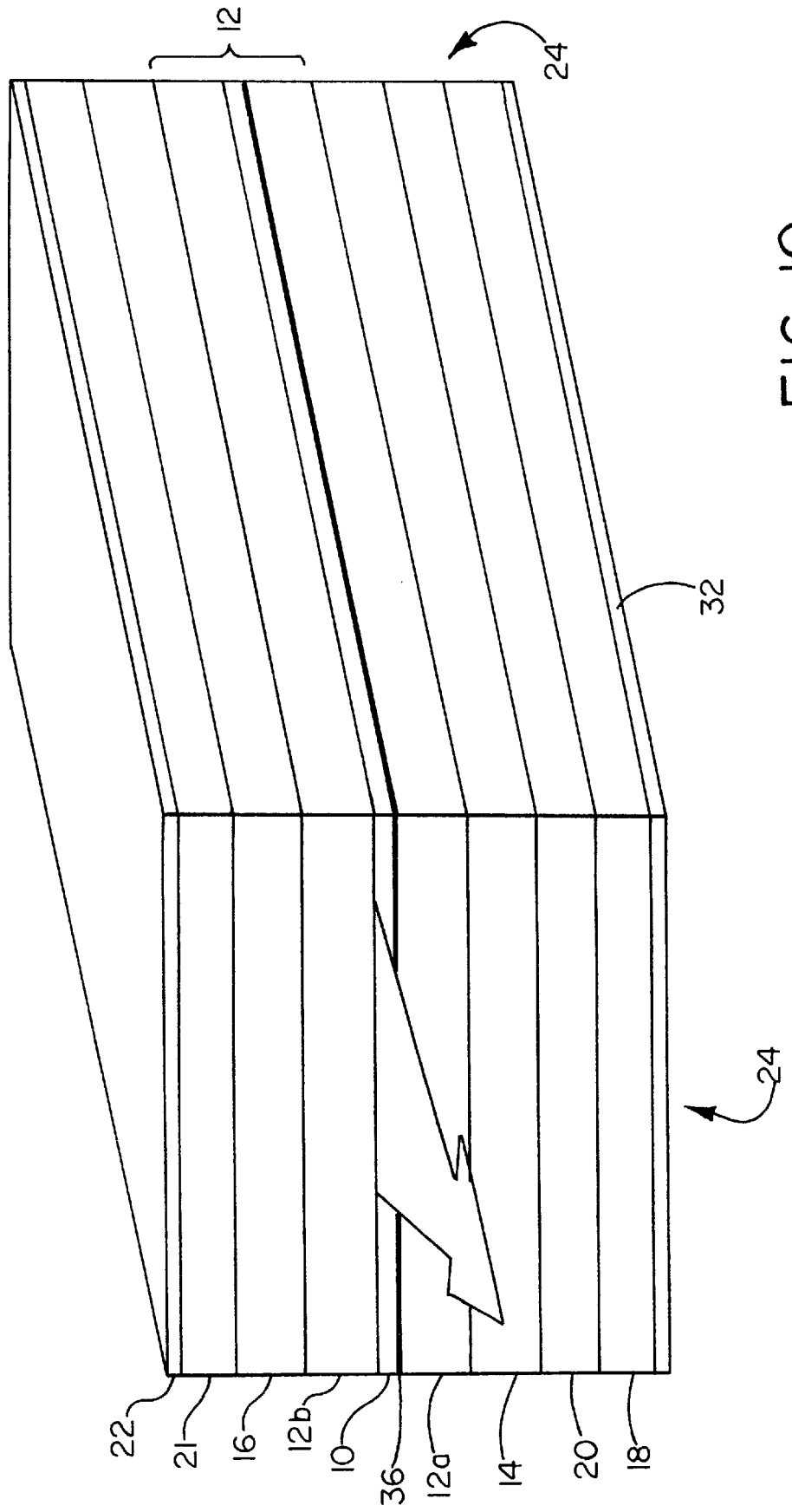
FIG. 10 is a schematic perspective view (not to scale) of the layer structure of an (AlGaIn)P edge emitting LD according to the present invention.

Referring now to FIG. 10, the edge-emitting LD illustrated therein comprises a layer structure comprising (InGa)P layer 10 defining the quantum well active region, undoped (AlGaIn)P layers 12a and 12b, respectively, defining the n-side and p-side optical guiding regions, n-doped (AlGaIn)P layer 14 defining the n-type cladding region p-doped (AlGaIn)P layer 16 defining the p-type cladding region, and electron-capture layer 36 formed of the same basic alloy composition as the (AlGaIn)P layers 14 and 16. The functions served by such layers will be readily apparent from the previous description. These layers are epitaxially grown on an n-doped GaAs substrate 18 having an n-doped GaAs buffer layer 20 thereon in a manner which will be well understood by those skilled in the art. A p-doped GaAs contact layer 21 is provided as a top layer of the LD. A p-side metal contact 22 and an n-side metal contact 32 are provided, respectively, on top of the layer 21 and on the underside of the substrate 18. Laser mirror facets 24 are formed by cleaved edges perpendicular to the plane of the substrate 18.

The edge-emitting LD of FIG. 10 operates in a manner which will be well understood by those skilled in the art having regard to the preceding description so that, in use, edge emission of light takes place in the direction of the arrow illustrated in FIG. 10.

Figure 11:
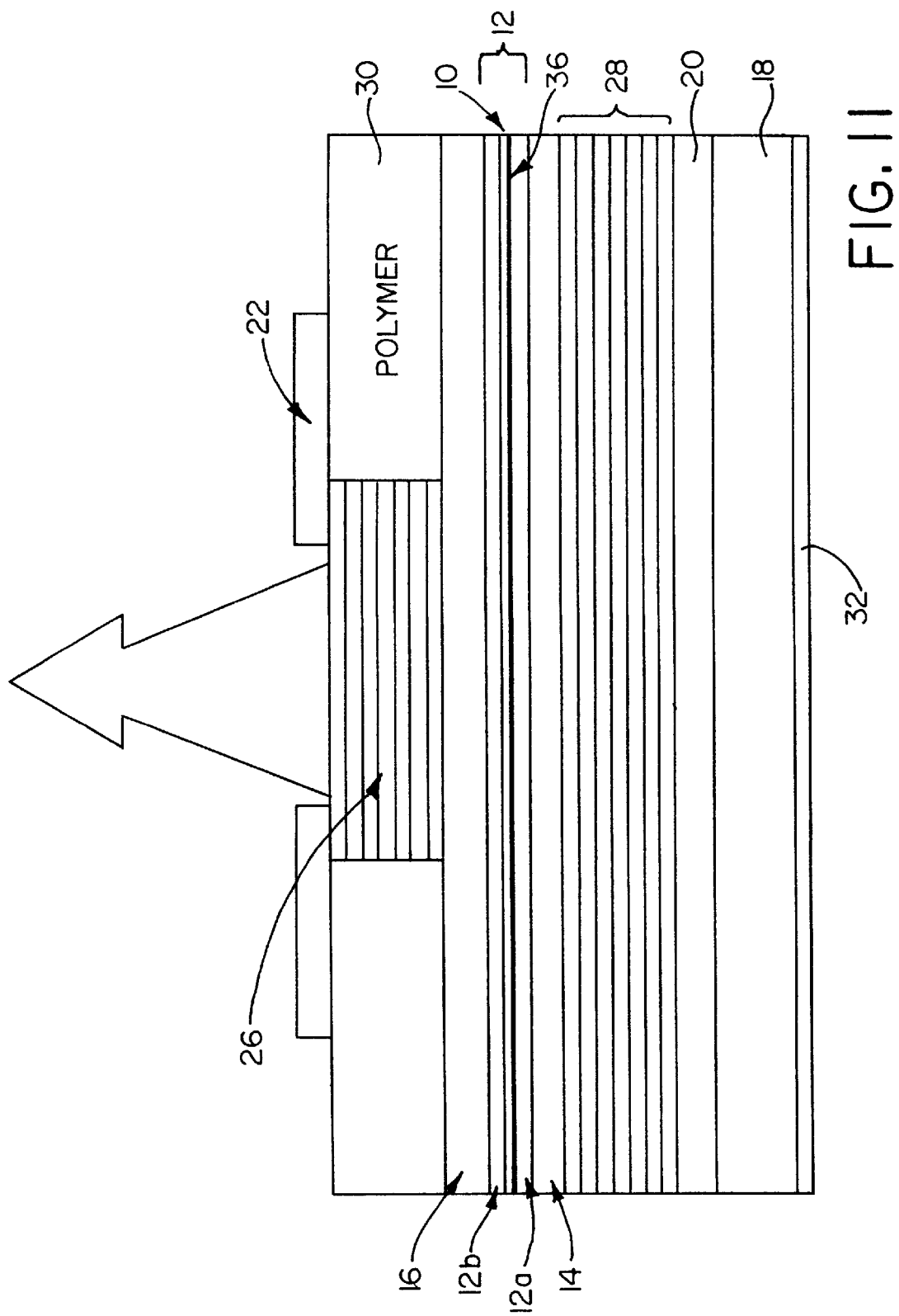
FIG. 11 is a schematic sectional view of an (AlGaIn)P vertical cavity surface emitting laser (VCSEL) device according to the present invention.

The VCSEL device of FIG. 11 is formed on n-doped GaAs substrate 18 having n-doped GaAs buffer layer 20 thereon, by epitaxially depositing and etching as necessary in a manner well known in the art. In FIG. 11, quantum well active region 10 and the optical guiding region 12 are illustrated for convenience as a single layer, but in practice the various regions 12a, 10 and 12b (as described previously) are grown in sequence. The guiding regions 12a and 12b are undoped. Electron-capture layer 36 is provided within the n-side optical guiding region 12a adjacent to the active region 10 in the manner described above in relation to FIG. 4. N-doped (AIGaIn)P layer 14 defines an n-doped spacer region which forms part of the cladding of the VCSEL. P-doped (AlGaIn)P layer 16 defines a p-doped spacer region which also forms part of the cladding of the VCSEL. Upper and lower p-type and n-type Bragg Reflectors (DBRs) 26 and 28 are also provided in the layer structure in a manner well known per se in the art. The upper DBR 26 is surrounded by an annular, electrically insulating polymer current-confining layer 30. Annular p-type upper contact 22 is provided above the DBR 26 and the layer 30. An n-type contact 32 is provided on the underside of the substrate 18.

As is well known with VCSELs, light emission occurs through central aperture in the annular upper contact 22 in the direction indicated by the arrow in FIG. 11.

Figure 12:
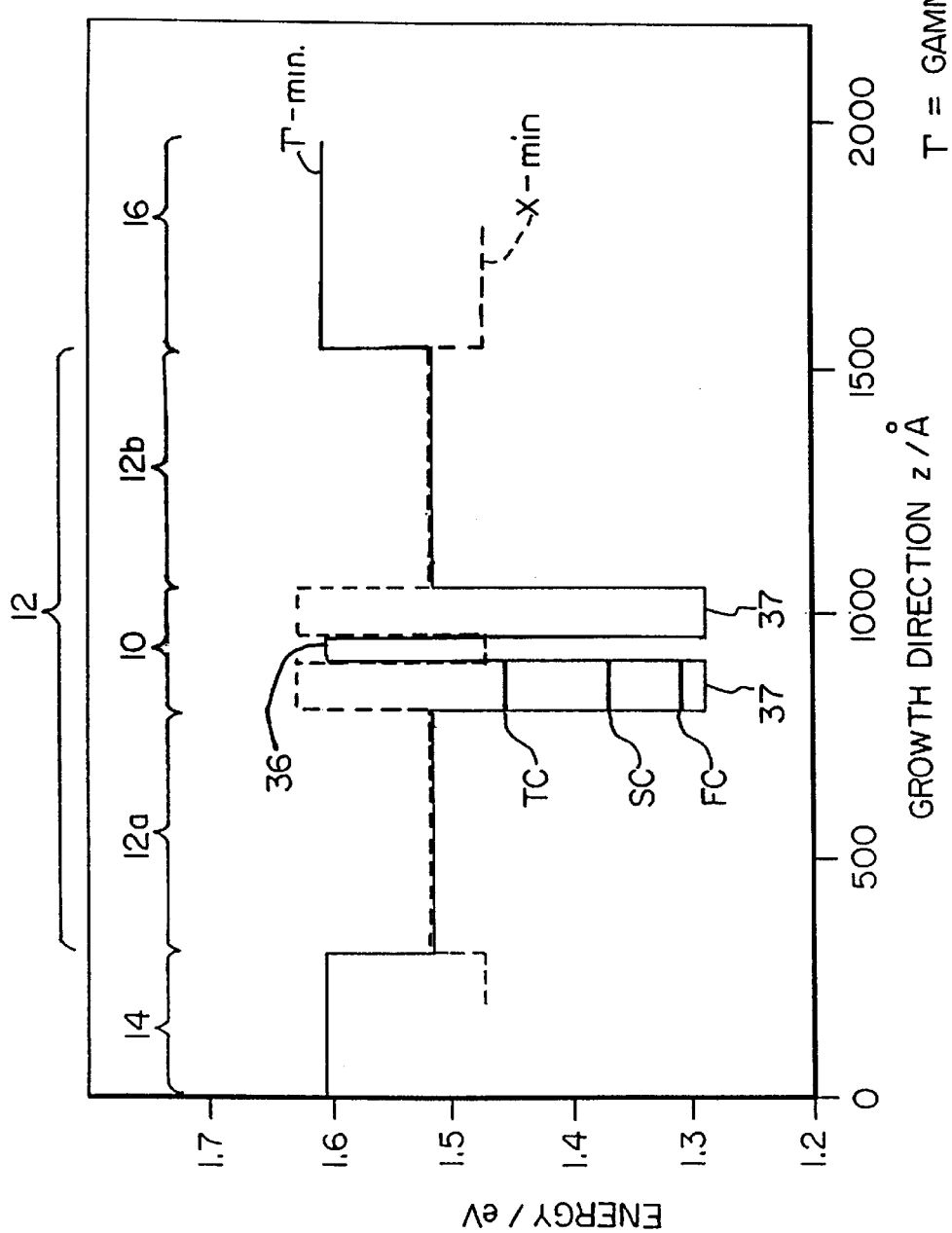
FIG. 12 is a schematic view of the conduction band profile of a further embodiment of SCH LD including the electron-capture layer of FIG. 4 according to the present invention.

FIG. 12 shows an alternative embodiment of the invention in which the active region 10 contains 2 quantum wells 37 and the electron-capture layer 36 is placed between the quantum wells. Positioning the electron-capture layer in this way means that the Γ-electrons need to have an increased energy to escape from the quantum wells to the Γ-minimum in the electron-capture layer. Moreover, the relatively high energy X-minimum of the quantum well material causes the well material itself to act as a barrier to any X-electrons which may find there way in to the electron-capture layer.

Figure 13:
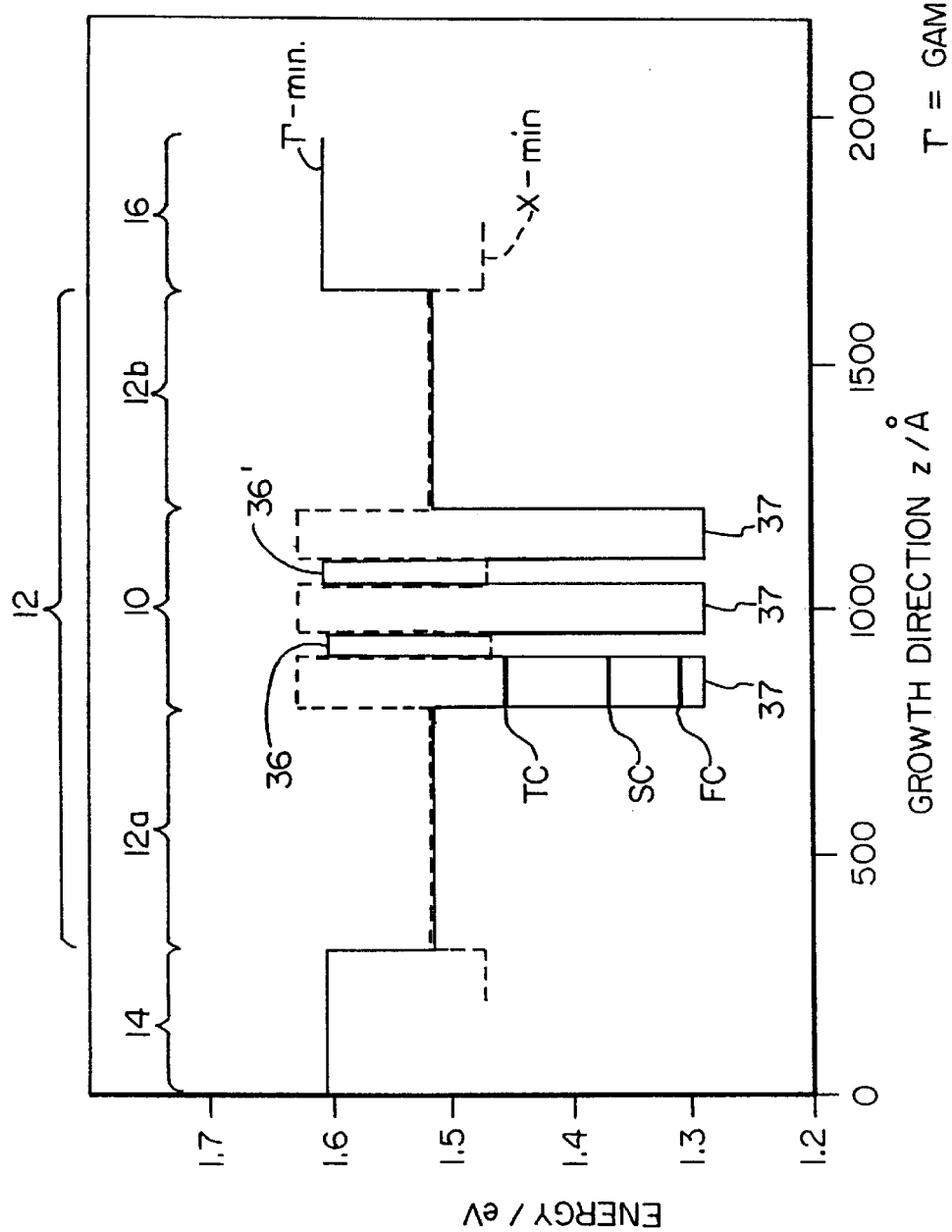
FIG. 13 is a schematic view of the conduction band profile of a further embodiment of SCH LD including the electron-capture layer of FIG. 4 according to the present inivention.

FIG. 13 shows a modification of the embodiment of FIG. 12. In this modified embodiment the active region 10 includes 3 quantum well layers 37. Two electron-capture layers 36, 36' are provided, one between each pair of adjacent quantum wells.

Figure 14:
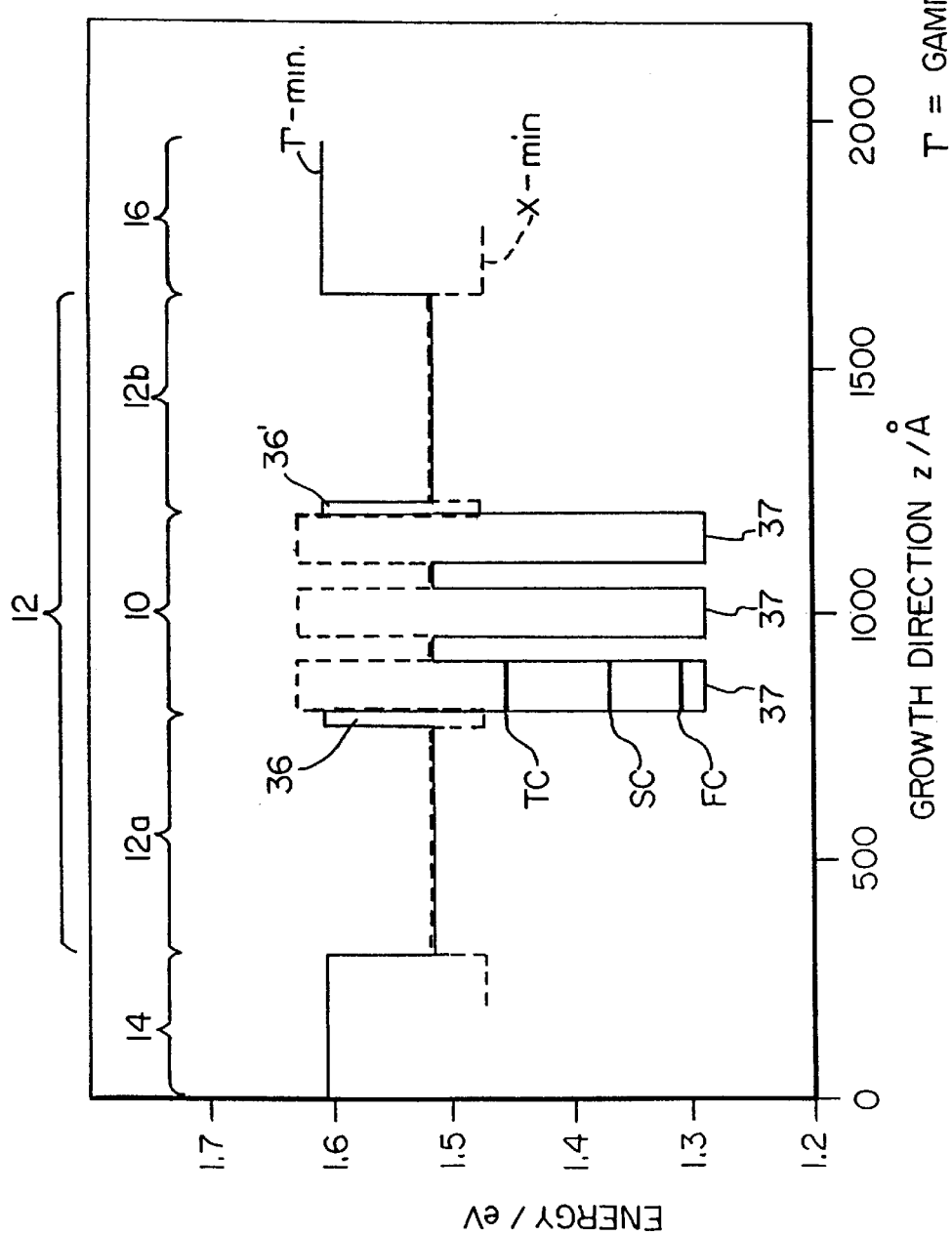
FIG. 14 is a schematic view of the conduction band profile of a further embodiment of SCH LD including the electron-capture layer of FIG. 4 according to the present invention.

FIG. 14 illustrates a modification of the embodiment shown in FIG. 4. An additional electron-capture layer 36' is provided in the p-type guiding region 12b adjacent to the active region 10. Providing an electron-capture layer on each side of the active region enables X-electrons to be trapped near the active region so that they can relax in to an energy well within the active region. The electron-capture layers are preferably disposed substantially symetrically relative to the active region, as shown in FIG. 14, and are of substantially the same composition and thickness. This enables the optical mode of the emitted laser light to be improved by increasing the symmetry of the refractive index profile of the optical guiding region.

It would also be possible to modify the embodiment shown in FIG. 5 by providing a second electron-capture layer within the p-type guiding layer 12b.

Figure 15:
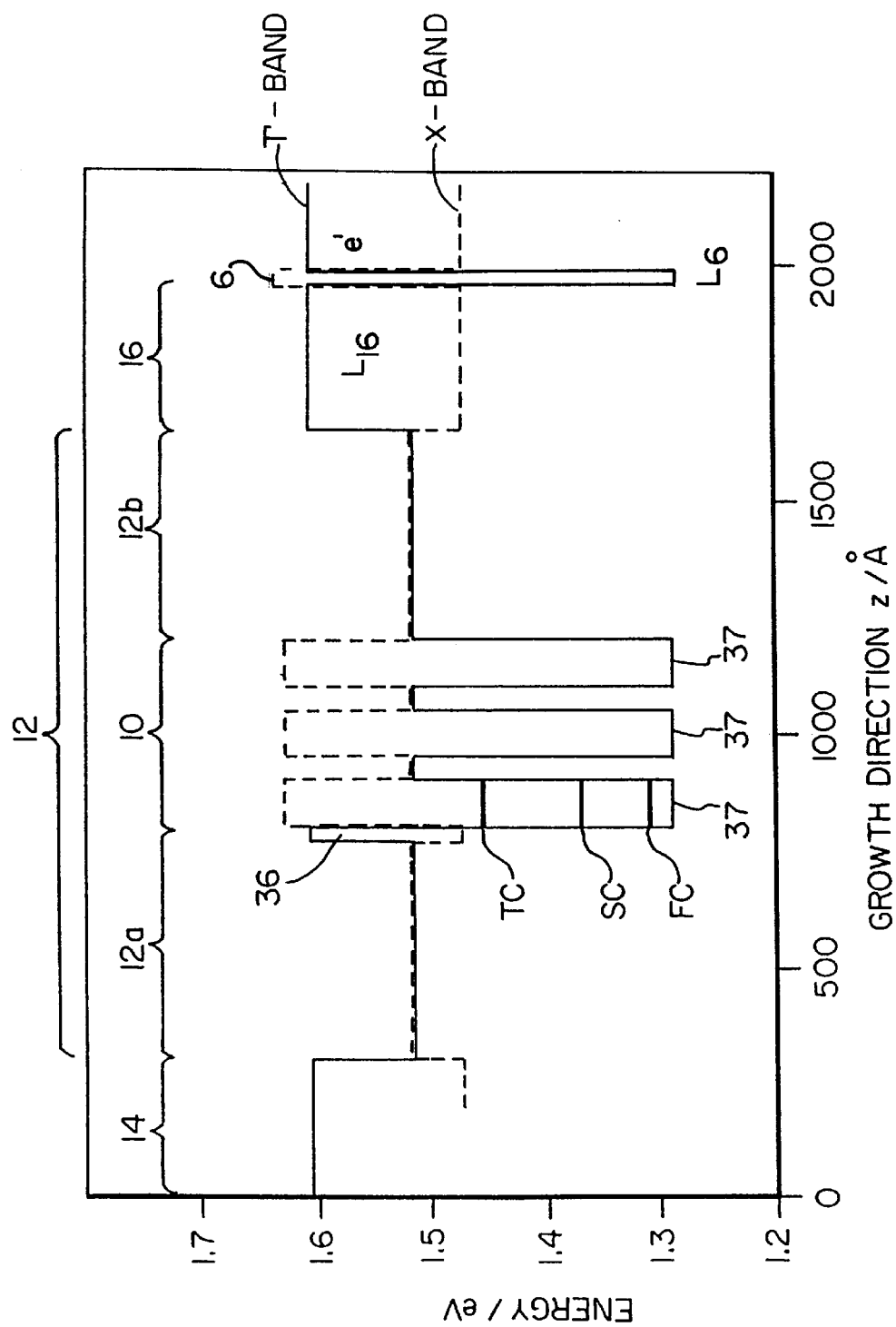
FIG. 15 is a schematic view of the conduction band profile of a further embodiment of SCH LD including the electron-capture layer of FIG. 4 according to the present invention and an electron-reflecting barrier layer in the p-type cladding region.

Referring now to FIG. 15, the arrangement is as described above in relation to FIG. 4, except that, in addition to the electron-capture layer 36, an electron-reflecting barrier layer 6 is provided in the p-type cladding region 16. In FIG. 15, $L_{16}$ indicates the thickness of the p-type cladding region 16. It will be seen that the X-minimum in the p-type cladding region 16 is below that in the p-side guiding region 12b. This means that any electrons which are thermally excited to the X-band of the guiding region 12b will thermalise down to the X-band in the p-type cladding region 16 where, in the absence of the barrier layer 6, they would be free either to recombine (a loss) or to drift and diffuse away from the active QW region (a further loss).

In order to reduce such losses, the barrier layer 6 which is of lattice-matched (InGa)P of thickness $L_6$ is inserted in an undoped portion of the p-type cladding region 16 as shown schematically. The thickness $L_6$ is chosen to be a value such that the first confined electron state (e') lies above that of the X-minima in the cladding and guiding regions 12b and 16. With e' in this energy position, it does not provide a state of lower energy into which electrons could thermalise and subsequently recombine. Thus, e' effectively defines the Γ-minimum in the barrier layer 6. If the barrier layer 6 consists of (InGa)P lattice-matched to GaAs, for example, then an appropriate value of $L_6$ would be 15 Å or less. It is still possible for carriers in the X-valley of the cladding region 16 to escape by two routes: (1) thermal escape from the cladding region 16 over the top of the barrier presented by the confined level e' or (2) tunnelling through the barrier layer 6, again with the barrier height being e'. The barrier height is governed by e' and not the X-minimum in the (InGa)P due to the Γ-X wavefunction mixing which occurs at the heterojunction interface. Mechanisms (1) and (2) above will be minimised if the carriers in the cladding region 16 have thermalised to the bottom of the X-band, where there will be the maximum barrier to surmount and the maximum barrier to tunnel through. The thickness $L_{16}$ of the cladding region 16 should ideally be adjusted to arrange such a situation. A thickness $L_{16}$ of >100 Å is considered to be of assistance in this respect.

In a particular example of this type of LD, the Capture Layer Laser as described above with reference to FIG. 8 is formed with barrier layer 6 a ~12 Å thick layer of $Ga_{0.515}In_{0.485}P$ situated some ~300 Å from the beginning of the guiding region 12b. The threshold current density of such an LD is approximately 33% less than that of the "Standard Laser" referred to above with reference to FIG. 8.

Figure 16:
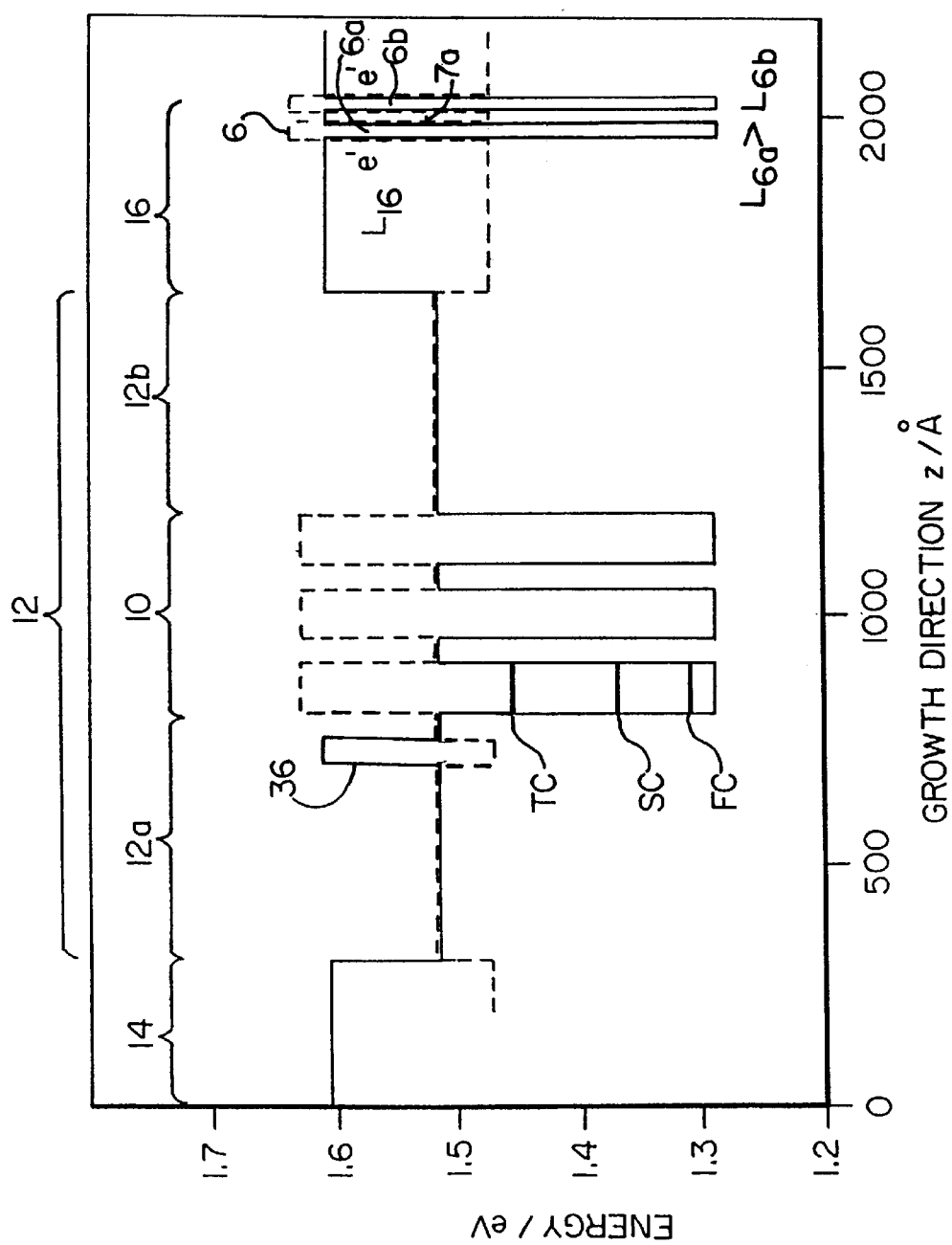
FIG. 16 is a schematic view of the conduction band profile of a still further embodiment of SCH LD including the electron-capture layer of FIG. 5 according to the present invention and two electron-reflecting barrier layers in the p-type cladding region.

Referring now to FIG. 16, the arrangement is as described above in relation to FIG. 5, except that, in addition to the electron-capture layer 36, two electron-reflecting barrier layers 6a and 6b are provided in the p-type cladding region 16 and are separated by a layer 7a of quaternary cladding material (AlGaIn)P. In this case, the barrier layer 6a is thicker than the barrier layer 6b to provide a rising step of e' levels to present an increasing tunnel barrier to electrons.

Figure 17:
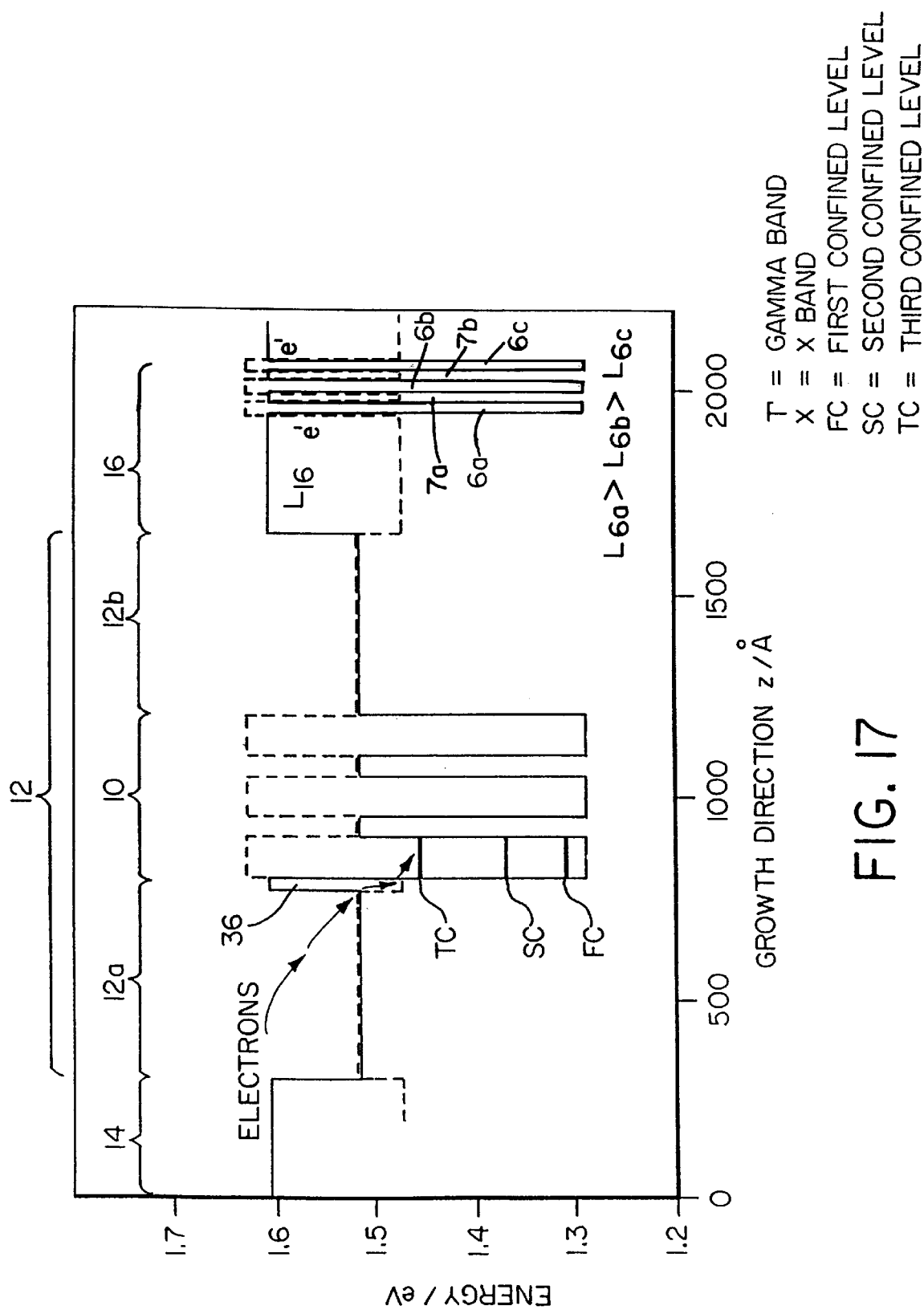
FIG. 17 is a schematic view of the conduction band profile of a further embodiment of SCH LD including the electron-capture layer of FIG. 6 according to the present invention and three electron-reflecting barrier layers in the p-type cladding region.

Referring now to FIG. 17, the arrangement is as described above in relation to FIG. 6, except that, in addition to the electron-capture layer 36, three electron-reflecting barrier layers 6a, 6b and 6c are provided in the p-type cladding region 16, separated by respective layers 7a and 7b of quaternary cladding material (AlGaIn)P. In this case, the thicknesses of such barrier layers 6a, 6b and 6c within the p-type cladding region 16 are chosen to decrease progressively away from guiding region 12b. This would then provide a rising staircase of e' levels to present an increasing tunnel barrier to electrons. Typical thicknesses might be 12 Å, 7 Å and 5 Å for the three barrier layers 6a, 6b and 6c, respectively. The separation between adjacent barrier layers in FIGS. 16 and 17, is preferably at least 2.85 Å and, more preferably, is in the range 7 Å to 15 Å.

Figure 18:
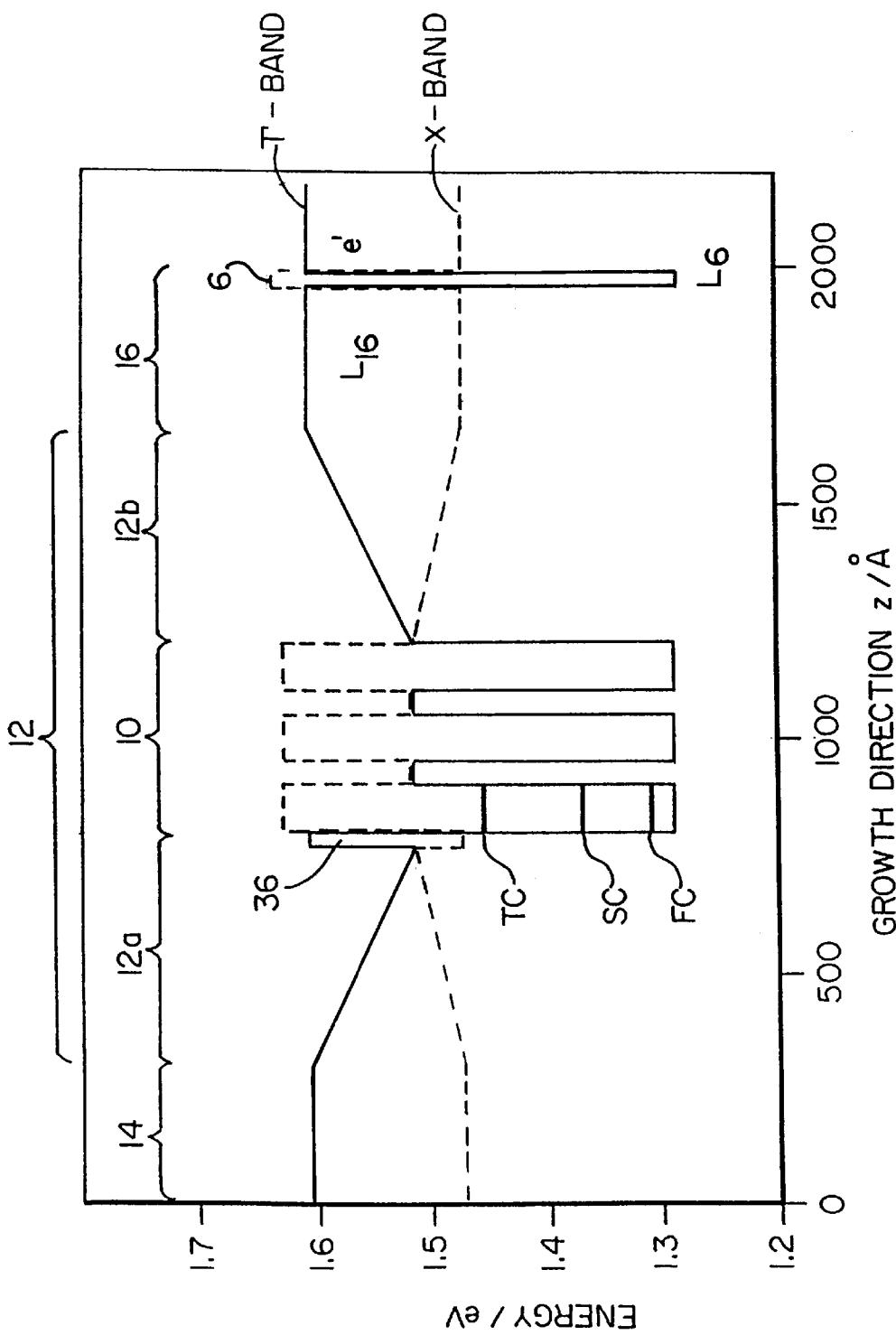
FIG. 18 is a schematic view of the conduction band profile of a further embodiment of SCH LD including the electron-capture layer of FIG. 4 according to the present invention in a graded index optical guiding region and and an electron-reflecting barrier layer in the p-type cladding region.

Referring now to FIG. 18, the arrangement is as described above in relation to FIG. 4, except that electron-reflecting barrier layer 6 is provided in the p-type cladding region and the layers 36 and 6 are employed in a Graded Refractive Index Separate Confinement Heterostructure (GRINSCH LD). Here the energy gap of each of the optical guiding regions 12a and 12b is varied in a graded manner from the respective cladding regions 14 and 16 to the active region 10 of the heterostucture. This grading may not necessarily be linear as shown in FIG. 18.

Figure 19:
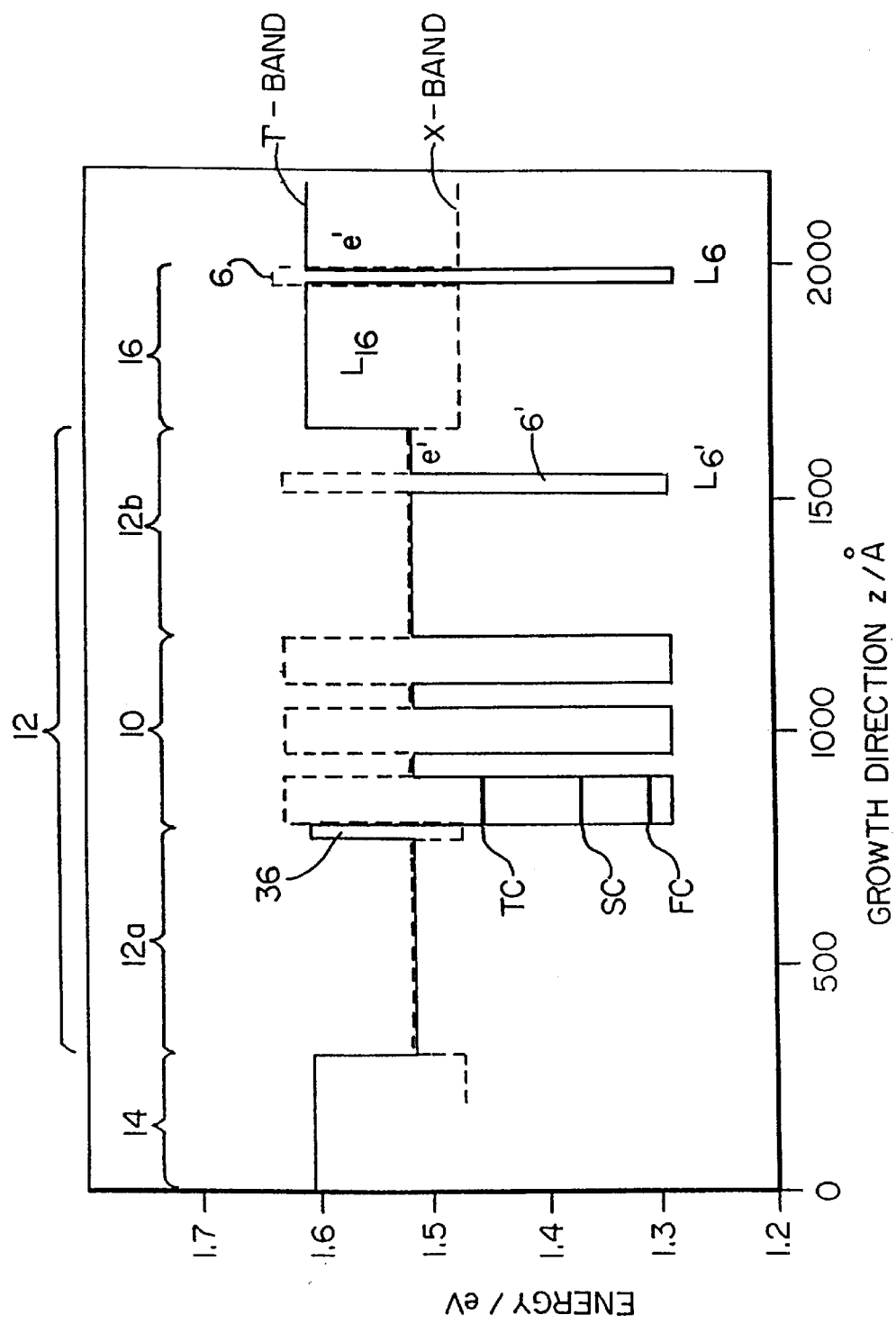
FIGS. 19 and 20 are schematic views of further embodiments of SCH LDs according to the present invention.

Referring now to FIG. 19, the arrangement is as described above in relation to FIG. 15 except that a firther electron-reflecting barrier layer 6' of identical compostion to that of the barrier layer 6 is provided in the p-side guiding region 12b near to the p-type cladding region 16. The barrier layer 6' has a thickness of 5 to 10 Å (although it may have a thickness between 5 and 50 Å). The arrangement is such that the first confined electron energy level e' in the barrier layer 6' is near to the Γ-minimum in the adjacent parts of the guiding region 12b on opposite sides of the layer 6'. As can be seen from FIG. 19, e' in the layer 6' is higher than the bound energy levels in the active region 10.

Figure 20:
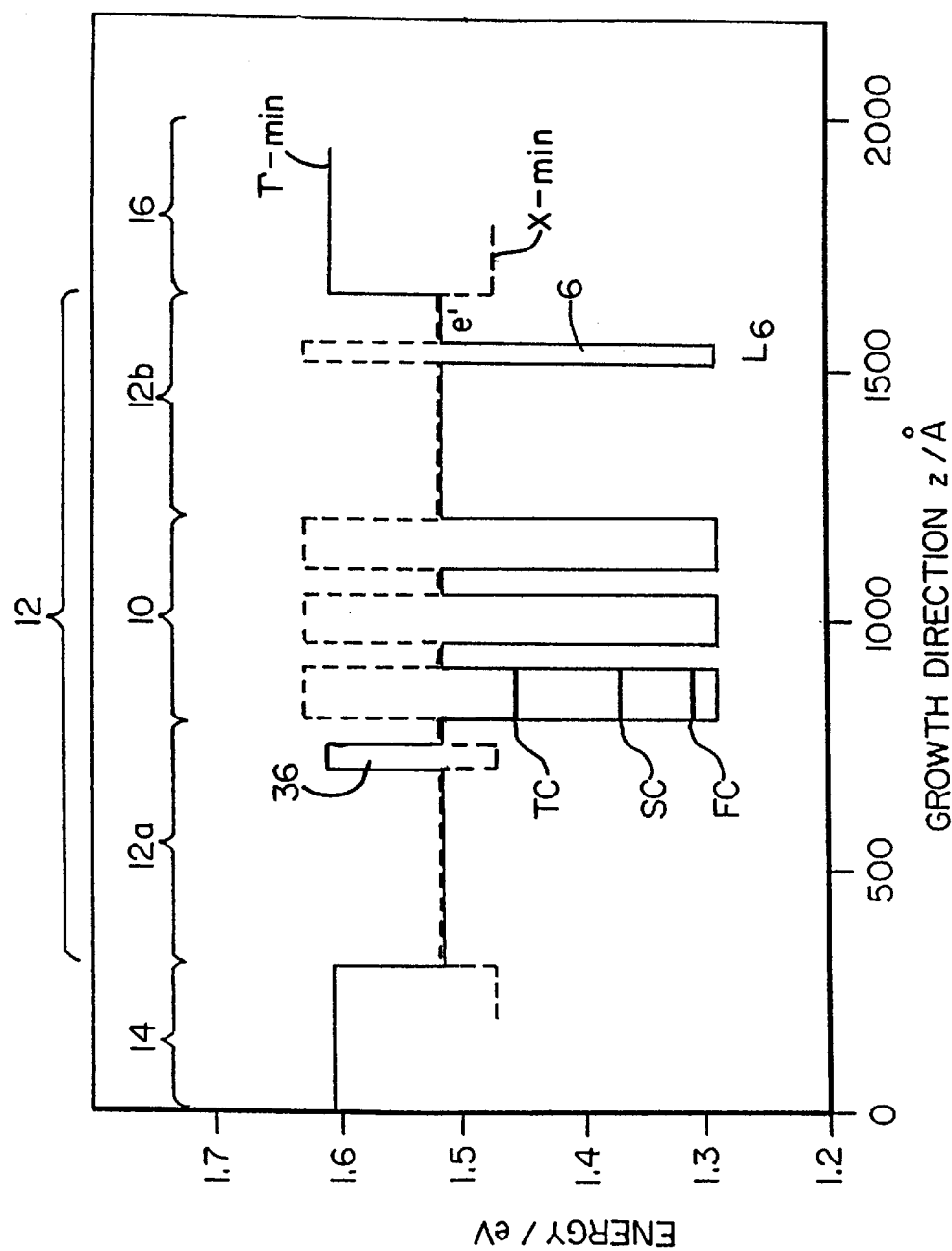

Referring now to FIG. 20, the arrangement is as described above in relation to FIG. 15 except that the electron-reflecting barrier layer. 6 is provided in the p-side guiding region 12b near to the p-type cladding region 16 rather than in the p-type cladding region 16 itself. The barrier layer 6 has a thickness of 5 to 10 Å (although it may have a thickness between 5 and 50 Å). The arrangement is such that the first confined electron energy level e' in the barrier layer 6 is near to the Γ-minimum in the adjacent parts of the guiding region 12b on opposite sides of the layer 6. As can be seen from FIG. 20, e' in the layer 6 is higher than the bound energy levels in the active region 10.

What is claimed is:

1. A separate confinement heterostructure (SCH) laser device (LD), comprising a heterostructure which includes:

an optical guiding region;

an active region having at least one energy well, the active region being provided in the optical guiding region; and n-type and p-type cladding regions provided on opposite sides of the optical guiding region, wherein a first electron-capture layer is provided in the active region or in a predetermined portion of the optical guiding region which is disposed between the active region and the n-type cladding region, a composition of the first electron-capture layer is set in such a manner that the electron-capture layer has an X-minimum which is lower than that in adjacent parts of the heterostructure, the first electron-capture layer is thick enough to bind X-electrons so that, in use, the first electron-capture layer promotes capture of the X-electrons, and the first electron-capture layer is disposed sufficiently close to the active region to permit transfer of the captured X-electrons to at least one Γ-confined level in the active region.

2. A laser device according to claim 1, wherein the thickness of the first electron-capture layer is set in such a manner as to allow tunnelling of Γ-electrons therethrough so that capture of the Γ-electrons into the active region is substantially uninhibited.

3. A laser device according to claim 1, wherein the thickness of the first electron-capture layer is set in such a manner as to reflect Γ-electrons so that, in use, the Γ-electrons reflected by the first electron-capture layer relax in energy and enter the at least one energy well in the active region vie an intermediate X-state in the first electron-capture layer.

4. A laser device according to claim 1, wherein the thickness of the first electron-capture layer is in the range of from 2 Å to 200 Å.

5. A laser device according to claim 2, wherein the thickness of the first electron-capture layer is in the range of from 2 Å to 30 Å.

6. A laser device according to claim 3, wherein the thickness of the first electron-capture layer is in the range of from 50 Å to 200 Å.

7. A laser device according to claim 6, wherein the composition of the first electron-capture layer is set in such a manner that the content of a substitutional element therein is higher than that in an n-side portion of the optical guiding region.

8. A laser device according to claim 7, wherein the content of the substitutional element in the composition of the first electron-capture layer is substantially equal to that in the n-type cladding region.

9. A laser device according to claim 1, wherein the first electron-capture layer is disposed in an n-side portion of the optical guiding region directly adjacent to the active region, and the X-minimum in the first electron-capture layer is lower than that in each of an adjacent part of the active region and an adjacent part of the n-side portion of the optical guiding region.

10. A laser device according to claim 9, wherein a growth interrupted interface exists between the first electron-capture layer and an energy well in the active region.

11. A laser device according to claim 1, wherein the first electron-capture layer is disposed in an n-side portion of the optical guiding region and is spaced from the active region, and the X-minimum in the first electron-capture layer is lower than that in each of adjacent parts of the n-side portion of the optical guiding region on opposite sides of the first electron-capture layer.

12. A laser device according to claim 11, wherein the spacing between the first electron-capture layer and the active region is small enough to allow transfer of bound X-electrons from the first electron-capture layer to $\Gamma$-states in the at least one energy well of the active region.

13. A laser device according to claim 1, wherein:
the active region includes first and second energy wells;
the first electron-capture layer is provided in the active region, and constitutes a barrier material between the first and second energy wells; and
the X-minimum in the first electron-capture layer is lower than that in each of the energy wells.

14. A laser device according to claim 13, wherein the active region includes more than two energy wells and one or more additional electron-capture layer, and the additional electron-capture layer constitutes a barrier material between the energy wells.

15. A laser device according to claim 1, wherein an additional electron-capture layer is further provided in or on an opposite side of the active region to the first electron-capture layer.

16. A laser device according to claim 15, wherein the additional electron-capture layer and the first electron-capture layer are substantially symmetrically arranged relative to the active region and have substantially the same composition and thickness with each other.

17. A laser device according to claim 1, further comprising a first electron-reflecting barrier layer provided in a p-side region of the laser device.

18. A laser device according to claim 17, wherein:
a composition of the first electron-reflecting barrier layer is set in such a manner that the first electron-reflecting barrier layer has an X-minimum which is higher than that in an adjacent portion of the p-side region at least on one selected side of the first electron-reflecting barrier layer, the selected side being disposed between the first electron-reflecting barrier layer and the active region, and electron tunneling between X-bands of adjacent portions of the p-side region on apposite sides of the first electron-reflecting barrier layer is prevented by satisfying at least one of a first condition and a second condition, the first condition being such that a thickness of the first electron-reflecting barrier layer is set at a sufficient value for preventing the electron tunneling, and the second condition being such that parts of the p-side region on the opposite sides of the first electron-reflecting barrier layer have compositions which are sufficiently different from one another for preventing the electron tunneling.

19. A laser device according to claim 17 wherein the first electron-reflecting barrier layer is provided in the p-type cladding region.

20. A laser device according to claim 19, wherein:
the composition of the first electron-reflecting barrier layer is set in such a manner that the X-minimum of the first electron-reflecting barrier layer is higher than that in an adjacent portion of the p-type cladding region at least on a predetermined side of the first electron-reflecting barrier layer, the predetermined side being disposed between the first electron-reflecting barrier layer and the optical guiding region;
one of the composition and the thickness of the first electron-reflecting barrier layer is set in such a manner that the first electron-reflecting barrier layer has a $\Gamma$-minimum which is higher than the X-minimum of the adjacent portion of the p-type cladding region; and
electron tunneling between X-bands of adjacent portions of the p-type cladding region on the opposite sides of the first electron-reflecting barrier layer is prevented by satisfying at least one of condition (a) and condition (b), the condition (a) being such that the thickness of the first electron-reflecting barrier layer is set at a sufficient value for preventing the electron tunneling, and the condition (b) being such that the adjacent portions of the p-type cladding region on the opposite sides of the first electron-reflecting barrier layer have compositions which are sufficiently different from one another for preventing the electron tunneling.

21. A laser device according to claim 19, wherein:
the composition of the first electron-reflecting barrier layer is set in such a manner that the X-minimum of the first electron-reflecting barrier layer is higher than that in adjacent portions of the p-type cladding region on both sides of the first electron-reflecting barrier layer;
one of the composition and the thickness of the first electron-reflecting barrier layer is set in such a manner that the first electron-reflecting barrier layer has a $\Gamma$-minimum which is higher than the X-minima of the adjacent portions of the p-type cladding region on the both sides of the first electron-reflecting barrier layer; and
electron tunneling between X-bands of the adjacent portions of the p-type cladding region on the opposite sides of the first electron-reflecting barrier layer is prevented by satisfying at least one of condition (a) and condition (b), the condition (a) being such that the thickness of the first electron-reflecting barrier layer is set at a sufficient value for preventing the electron tunneling, and the condition (b) being such that the adjacent portions of the p-type cladding region on the opposite sides of the first electron-reflecting barrier layer have compositions which are sufficiently different from one another for preventing the electron tunneling.

22. A laser device according to claim 19, wherein a thickness of a part of the p-type cladding region disposed between the first electron-reflecting barrier layer and the optical guiding region is not less than 100 Å.

23. A laser device according to claim 19, wherein a thickness of a part of the p-type cladding region disposed between the first electron-reflecting barrier layer and the optical guiding region is in the range from 100 Å to 1 μm.

24. A laser device according to claim 19, wherein the thickness of the first electron-reflecting barrier layer is 20 Å to 3 Å.

25. A laser device according to claim 19, wherein the thickness of the first electron-reflecting barrier layer is 15 Å to 7 Å.

26. A laser device according to claim 19, wherein the thickness of the first electron-reflecting barrier layer is set in such a manner that a first confined electron state therein lies above that of the X-minima in adjacent parts of the cladding region and the optical guiding region.

27. A laser device according to claim 17, wherein the first electron-reflecting barrier layer is provided in a p-side portion of the optical guiding region.

28. A laser device according to claim 27, wherein the thickness of the first electron-reflecting barrier layer is 5 Å to 50 Å.

29. A laser device according to claim 27, wherein the thickness of the first electron-reflecting barrier layer is 5 Å to 10 Å.

30. A laser device according to claim 17, wherein the first electron-reflecting barrier layer has substantially the same composition as that of the active region.

31. A laser device according to claim 17, wherein at least one additional electron-reflecting barrier layer is further provided in the p-side region of the laser device.

32. A laser device according to claim 31, wherein the at least one additional electron-reflecting barrier layer is provided in the same portion of the p-side region of the laser device as that in which the first electron-reflecting barrier layer is provided.

33. A laser device according to claim 31, wherein the at least one additional electron-reflecting barrier layer is provided in a different portion of the p-side region of the laser device from that in which the first electron-reflecting barrier layer is provided.

34. A laser devide according to claim 31, wherein thicknesses of the at least one additional electron-reflecting barrier layer and the first electron-reflecting barrier layer are set so as to decrease in a direction away from the active region.

35. A laser device according to claim 31, wherein a separation region separating adjacent two of the electron-reflecting barrier layers is not less than 2.85 Å.

36. A laser device according to claim 31, wherein the separation region is in the range from 7 Å to 15 Å.

37. A laser device according to claim 1, wherein the laser device is provided based on an alloy system of GaInP/(AlGaIn)P.

38. A laser device according to claim 37, wherein the alloy system is represented as $(In_xGa_{1-x})P/(Al_yGa_{1-y})_zIn_{1-z}P$, where $0.3 \leq x \leq 0.6$, y is in the range from 0 to 1, and z is in the range from 0.3 to 0.6.

39. A laser device according to claim 38, wherein a value of z is selected to ensure that the alloy system of $(AlGa)_zIn_{1-z}P$ has the same lattice constant as GaAs.

40. A laser device according to claim 38, wherein a value of z is 0.515.

41. A laser device according to claim 1, wherein the laser device is provided based on an alloy system of AlGaAs.

42. A laser device according to claim 1, wherein the alloy system is represented as $GaAs/(Al_xGa_{1-x})As$, where x is in the range from 0 to 1.

43. A laser device according to claim 1, wherein the laser device is of a Graded Refractive Index Separate Confinement Heterostructure type.

44. A laser device according to claim 1, wherein the laser device is of an edge-emitting type.

45. A laser device according to claim 1, wherein the laser device is of a surface-emitting type.

* * * * *